(12) United States Patent
Ryley, III et al.

(10) Patent No.: US 11,809,165 B2
(45) Date of Patent: *Nov. 7, 2023

(54) EFFICIENT AND MANUFACTURABLE MECHANICAL COMPUTING

(71) Applicant: CBN Nano Technologies Inc., Ottawa (CA)

(72) Inventors: James F. Ryley, III, Downey, CA (US); Mark N. Jobes, Ottawa (CA); Jeffrey E. Semprebon, Claremont, NH (US)

(73) Assignee: CBN Nano Technologies Inc., Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/041,235

(22) PCT Filed: Sep. 22, 2021

(86) PCT No.: PCT/US2021/051407
§ 371 (c)(1),
(2) Date: Feb. 10, 2023

(87) PCT Pub. No.: WO2022/066680
PCT Pub. Date: Mar. 31, 2022

(65) Prior Publication Data
US 2023/0244263 A1     Aug. 3, 2023

Related U.S. Application Data

(60) Provisional application No. 63/083,276, filed on Sep. 25, 2020, provisional application No. 63/083,265, filed on Sep. 25, 2020.

(51) Int. Cl.
*G05B 19/4155* (2006.01)
*G06D 3/00* (2006.01)
(Continued)

(52) U.S. Cl.
CPC ........ *G05B 19/4155* (2013.01); *B82Y 10/00* (2013.01); *G06C 15/02* (2013.01);
(Continued)

(58) Field of Classification Search
CPC ...... G05B 19/4155; G05B 2219/33291; B82Y 10/00; G06C 15/02; G06D 3/00;
(Continued)

(56) References Cited

U.S. PATENT DOCUMENTS

| 4,788,453 A | 11/1988 | Bohnen et al. |
| 5,892,301 A | 4/1999 | Warnatz |

(Continued)

FOREIGN PATENT DOCUMENTS

WO        2017116482 A1      7/2017

OTHER PUBLICATIONS

R. Merkle et al. Mechanical computing systems using only links and rotary joints. ASME Journal on Mechanisms and Robotics. (2018) vol. 10, pp. 061006.

(Continued)

*Primary Examiner* — Seung H Lee

(57) ABSTRACT

Logic mechanisms operate to define the position of at least one mechanical output based on the position of two or more mechanical inputs, and employ at least one control element that functions to determine (at least in part) whether an output is moved, and which provides the same function in more than one position. Some mechanisms are configured to determine, based on the input positions, whether a path to transmit motion to an output exists or does not exist. Some mechanisms are configured to determine, based on the input positions, whether or not motion of a driven element can be accommodated without moving an output.

6 Claims, 16 Drawing Sheets

(51) Int. Cl.

| | | |
|---|---|---|
| *B82Y 10/00* | (2011.01) | |
| *G06F 5/01* | (2006.01) | |
| *H03K 19/20* | (2006.01) | |
| *G06N 10/00* | (2022.01) | |
| *G06C 15/02* | (2006.01) | |
| *H01B 3/18* | (2006.01) | |
| *H01B 3/30* | (2006.01) | |
| *H03K 19/21* | (2006.01) | |

(52) U.S. Cl.
CPC ............ *G06D 3/00* (2013.01); *G06F 5/01* (2013.01); *G06N 10/00* (2019.01); *H01B 3/18* (2013.01); *H01B 3/307* (2013.01); *H03K 19/20* (2013.01); *H03K 19/21* (2013.01); *G05B 2219/33291* (2013.01)

(58) Field of Classification Search
CPC .. G06F 5/01; G06N 10/00; H01B 3/18; H01B 3/307; H03K 19/20; H03K 19/21; H03K 19/02
See application file for complete search history.

(56) References Cited

U.S. PATENT DOCUMENTS

| | | | |
|---|---|---|---|
| 8,171,568 | B2 | 5/2012 | Freitas et al. |
| 8,276,211 | B1 | 9/2012 | Freitas, Jr. et al. |
| 9,676,677 | B2 | 6/2017 | Freitas, Jr. et al. |
| 10,067,160 | B2 | 9/2018 | Merkle et al. |
| 10,072,031 | B1 | 9/2018 | Merkle et al. |
| 10,122,365 | B2 | 11/2018 | Pascall et al. |
| 10,138,172 | B2 | 11/2018 | Freitas, Jr. et al. |
| 10,197,597 | B2 | 2/2019 | Allis et al. |
| 10,308,514 | B2 | 6/2019 | Freitas et al. |
| 10,309,985 | B2 | 6/2019 | Allis et al. |
| 10,481,866 | B2 | 11/2019 | Merkle et al. |
| 10,664,233 | B2 | 5/2020 | Merkle et al. |
| 10,678,293 | B2 | 6/2020 | Pascall et al. |
| 10,683,924 | B1 | 6/2020 | Ryley, III |
| 10,822,229 | B2 | 11/2020 | Merkle et al. |
| 10,822,230 | B2 | 11/2020 | Freitas, Jr. et al. |
| 10,949,166 | B2 | 3/2021 | Merkle et al. |
| 11,391,355 | B2 | 7/2022 | Ryley, III |
| 11,720,084 | B2 * | 8/2023 | Ryley, III ............... H01B 3/18 700/117 |
| 2018/0248552 | A1 | 8/2018 | Pascall et al. |
| 2020/0142440 | A1 | 5/2020 | Pascall et al. |
| 2021/0149630 | A1 | 5/2021 | Merkle et al. |

OTHER PUBLICATIONS

Drexler. Nanomechanical Computation Systems. Nanosystems Molecular Machinery, Manufacturing, and Computation. (1992) pp. 342-371. New York: John Wiley & Sons, Inc..

Modi et al. Design, Analysis and Fabrication of a Microflexural and Gate. 13th National Conference on Mechanisms and Machines (NaCoMM07). (2007). Bangalore, India.

Svoboda. Computing Mechanisms and Linkages. H. James (Ed.). (1965) pp. 359. New York: Dover Publications.

Ion, Wall, Kovacs, & Baudisch. Digital Mechanical Metamaterials. Proceedings of the 2017 CHI Conference on Human Factors in Computing Systems—CHI '17. (2017) pp. 977-988.

Raney et al. Stable propagation of mechanical signals in soft media using stored elastic energy. Proc Natl Acad Sci U S A. (2016), Aug. 16, 2016 ed., vol. 113, pp. 9722-9727.

Song et al. Additively manufacturable micro-mechanical logic gates. Nature Communications. (2019) vol. 10.

Hilton, William; "K'Nex Adding Machine", published on YouTube Dec. 5, 2006 at URL: https://www.youtube.com/watch?v=3vXIQZvS-nM, screenshots from video taken Oct. 13, 2021.

Carnegie Mellon University, "Build 18: LEGO gates", published online Jan. 26, 2013 at URL: https://mechalogic.wordpress.com/2013/01/26/build-18-lego-gates/, website accessed Oct. 13, 2021.

Patrick Barnes, "Logic Gate Linkage Calculations" published oct. 13, 2014 and "Springless Reversible Mechanical Logic" published Oct. 8, 2014 at URL: https://mindbleach.com/words/tag/mechanical-logic/, website accessed Oct. 13, 2021.

Deo, H.V. and Amarnath, C, "Synthesis Of Circuit Breaker Mechanisms Based On Mechanical Logic Gates", 11th National Conference on Machines and Mechanisms, New Delhi, India, Dec. 18-19, 2003.

* cited by examiner

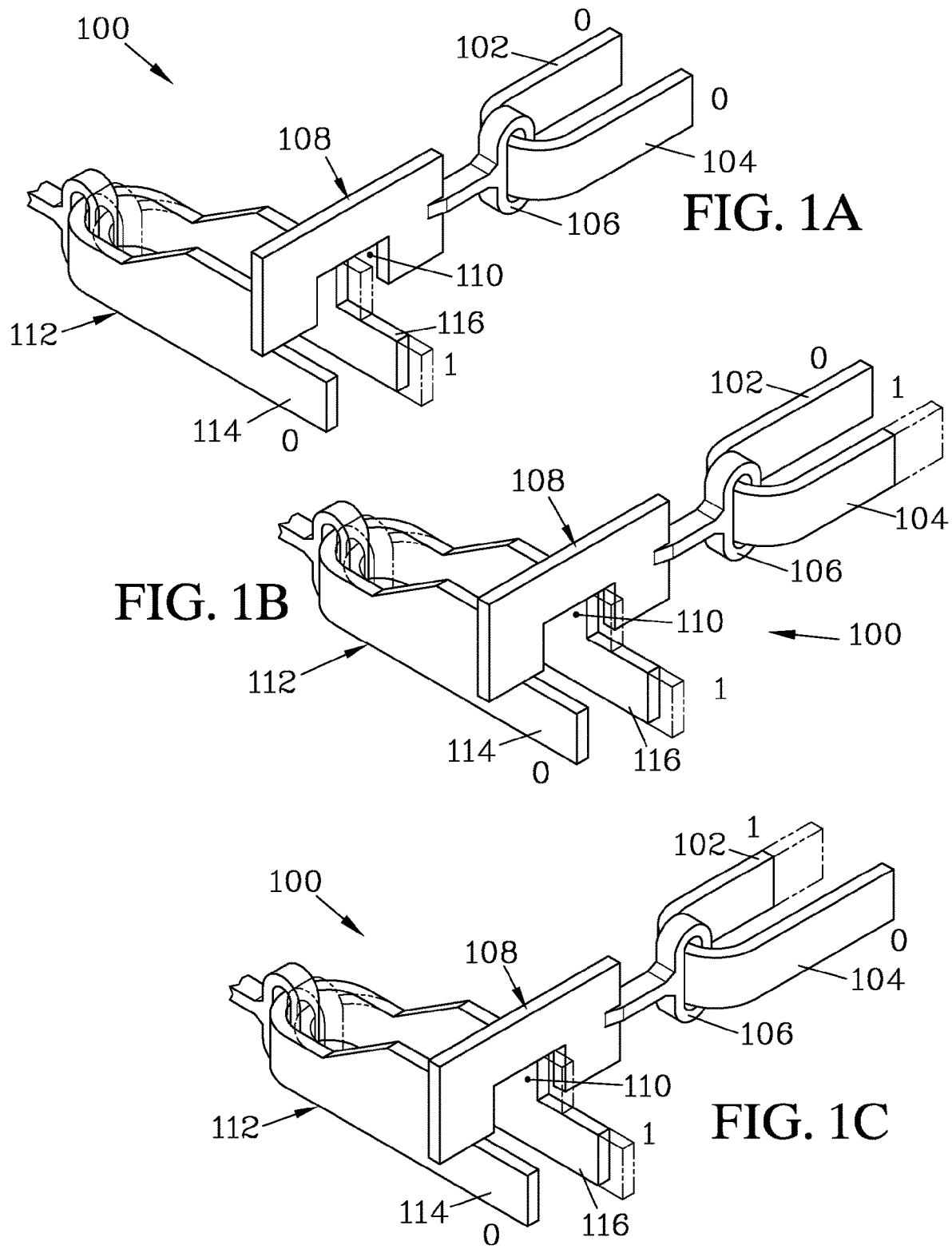

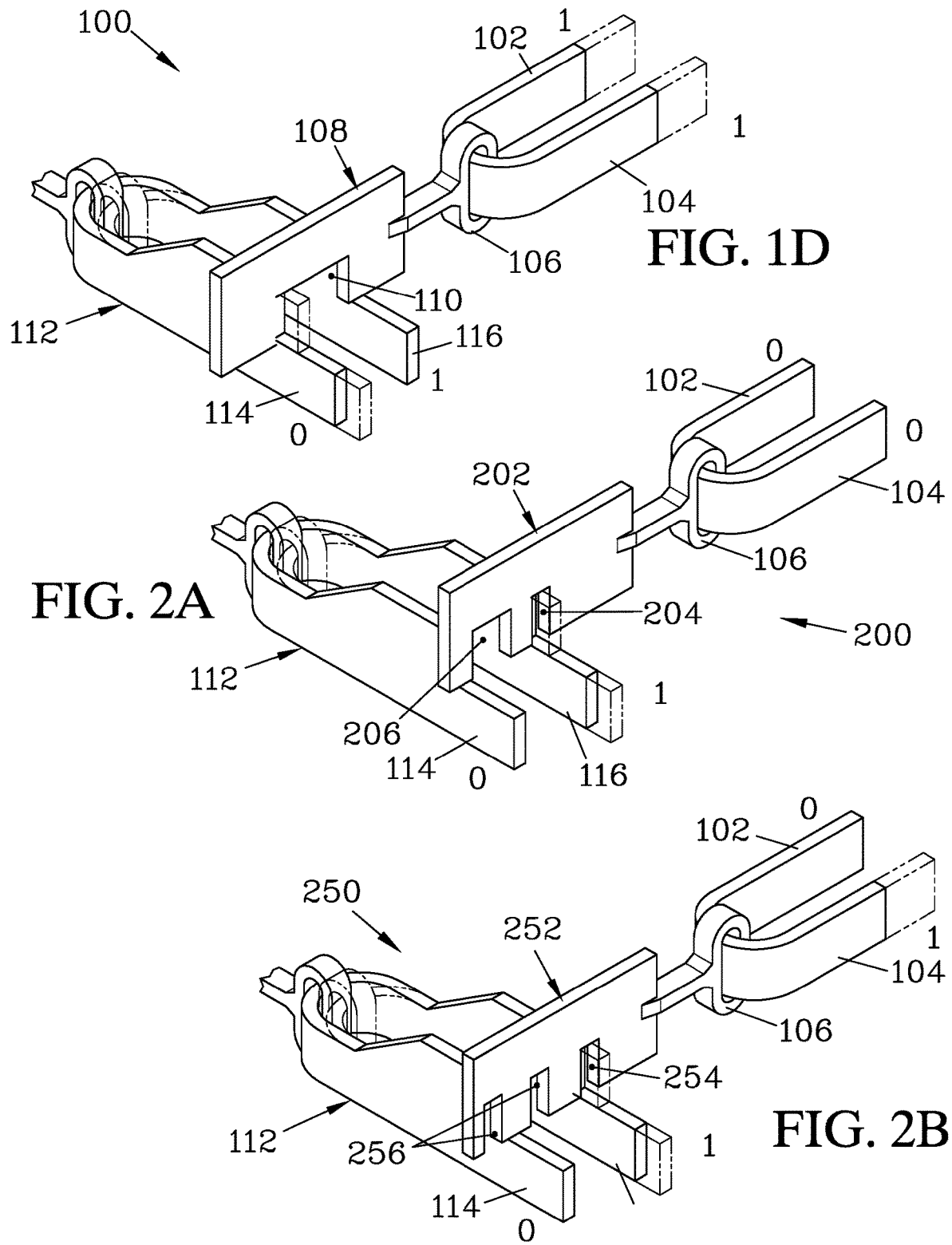

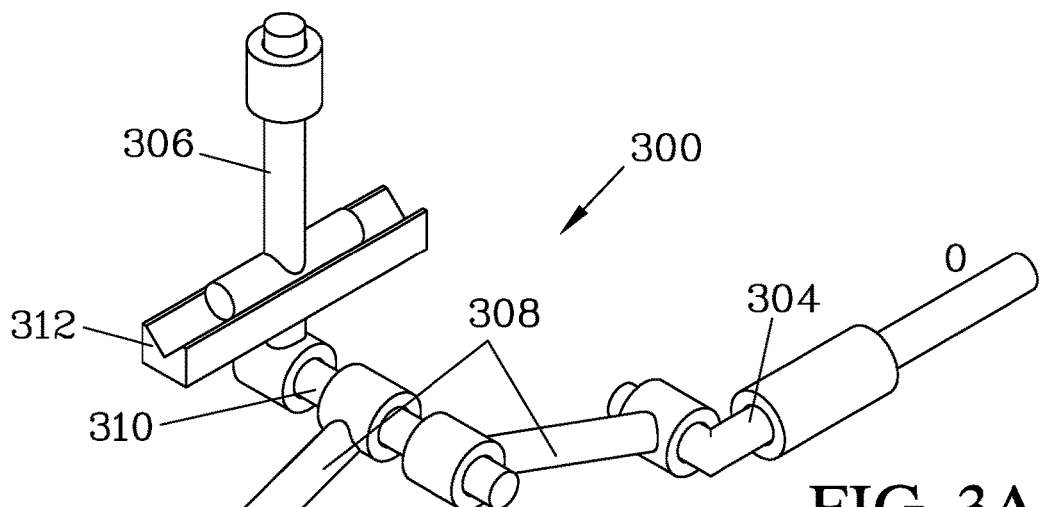
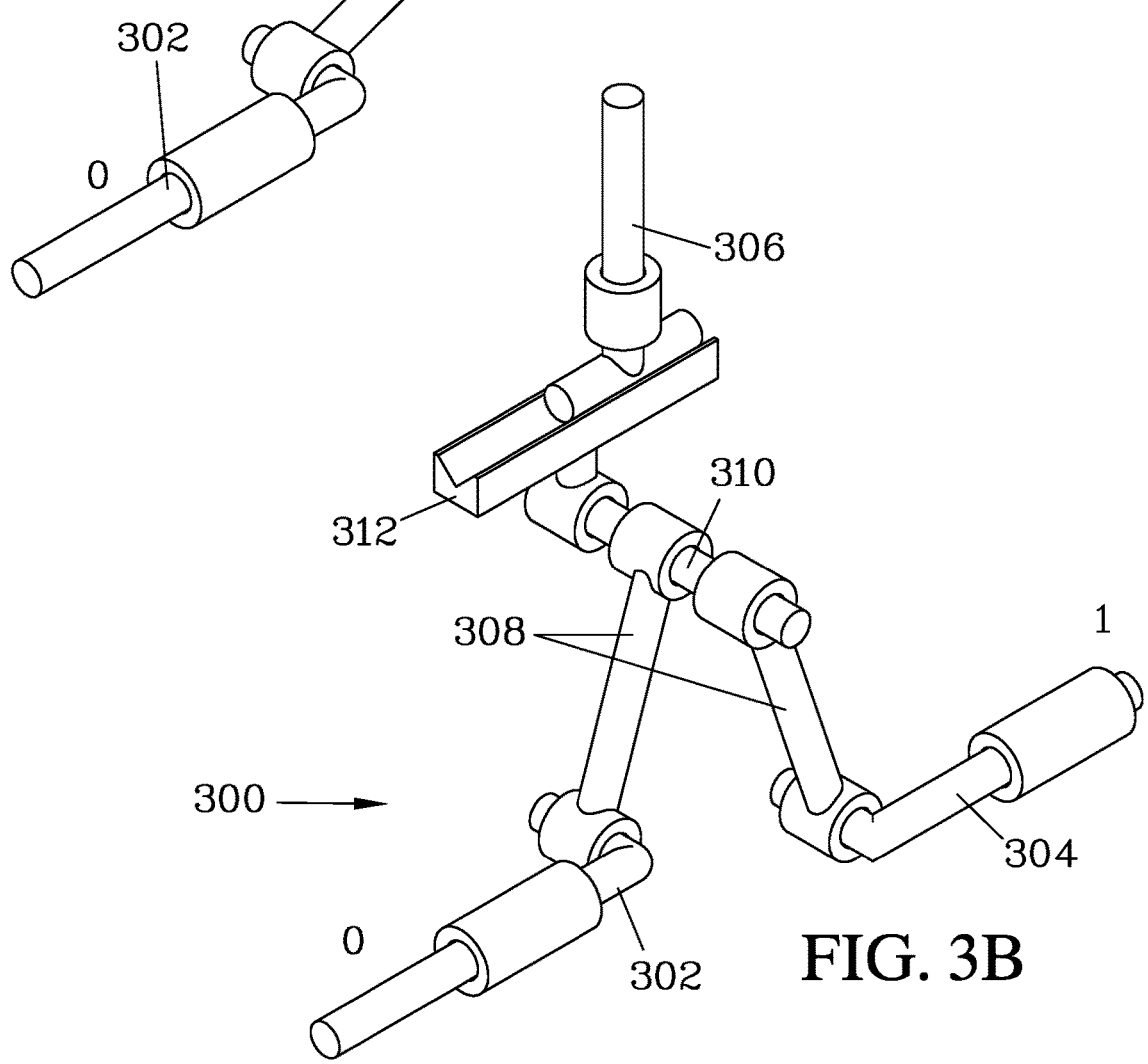
FIG. 3A
FIG. 3B

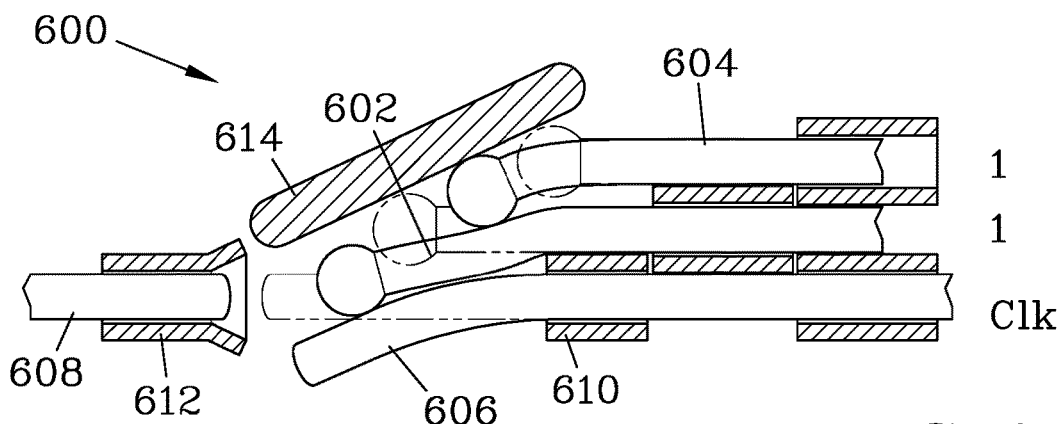
FIG. 6D
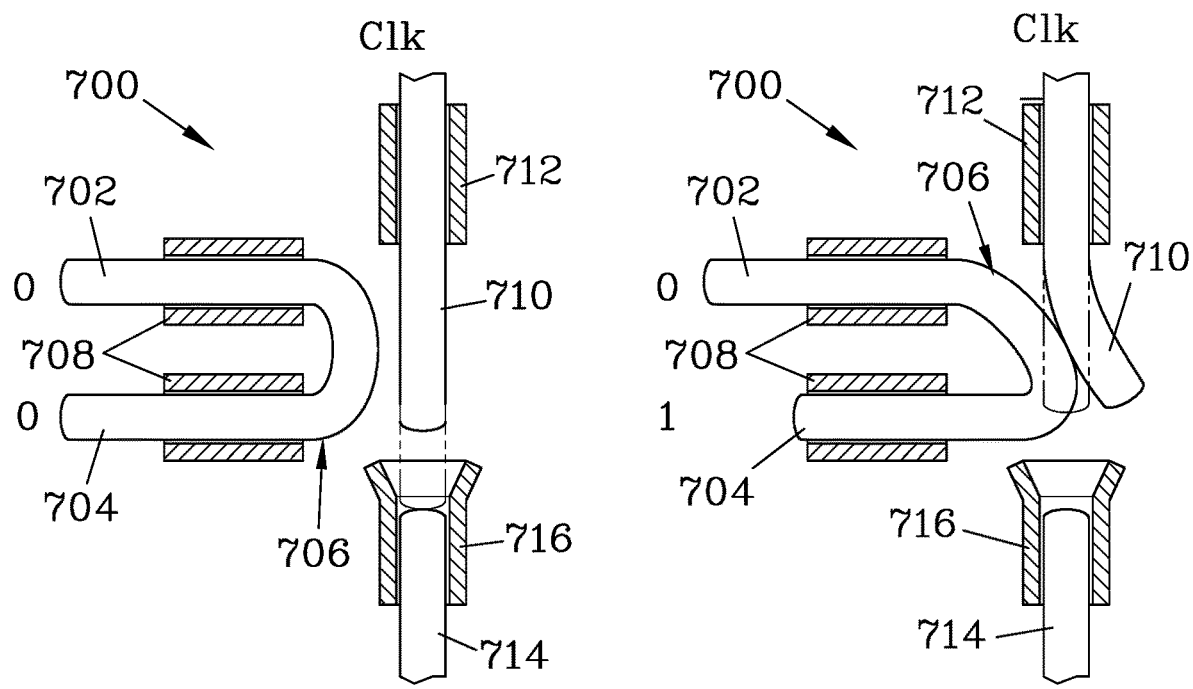
FIG. 7A
FIG. 7B

EFFICIENT AND MANUFACTURABLE MECHANICAL COMPUTING

TECHNICAL FIELD

The present application relates to mechanical logic structures, including schemes for logic mechanisms that can be compact, efficient, and/or amenable to fabrication at small scales.

BACKGROUND

Mechanical logic and computing designs date back to Babbage's Analytical Engine, described in 1837. More recently, there has been interest in developing mechanical logic for nanotechnology computers, such as the rod logic described by Drexler in his 1992 book "Nanosystems: Molecular Machinery, Manufacturing, and Computation". Mechanical logic mechanisms designed for reduced energy consumption are taught in U.S. Pat. Nos. 10,481,866 and 10,664,233, 10,949,166, and U.S. Publication 2021/0149630, all incorporated herein by reference in those jurisdictions where such incorporation is appropriate. Mechanisms such as taught in the '866 patent are designed to be suitable for molecular-scale fabrication by mechanosynthesis (such as the techniques taught in U.S. Pat. Nos. 8,171,568; 8,276,211; 9,676,677; 10,067,160; 10,072,031; 10,138,172; 10,197,597; 10,308,514; 10,309,985; 10,822,229; and 10,822,230, all incorporated herein by reference in those jurisdictions where such incorporation is appropriate); however, such mechanisms are typically also suitable for larger-scale fabrication using conventional techniques such as micro- and nano-lithography techniques, other MEMS ("MicroElectroMechanical Systems") or NEMS ("NanoElectroMechanical Systems") techniques, and via macroscopic manufacturing techniques (e.g., CNC, casting, molding, 3D printing) to create mechanical computing devices suitable for purposes including computation, computational system testing and design, and educational models.

SUMMARY

The following remarks summarize several aspects of the invention to facilitate an understanding of some of the inventive aspects claimed in the present application. However, the following summary is not intended to be limiting, and additional inventive aspects should be apparent from the entirety of the disclosure and claims.

Logic mechanisms as taught herein have two or more mechanical inputs and at least one mechanical output, and are configured to define the position of the output(s) based on the positions of the inputs. Mechanisms may have two or more outputs. In some cases, the inputs determine the position that one or more outputs reside in after a driven element of the mechanism (which could be considered as an additional input) has been displaced. In some cases, movement of the inputs directly moves the output(s) to a position.

Some mechanisms have at least one control element that is positioned by the inputs, and where the control element(s) interacts with either or both of the driven element and the output to determine whether or not movement of the driven element is transmitted to the output, with the further condition that at least one of the control element(s) provides the same function in more than one position. In some such mechanisms, the control element(s) are positionable to create a path for transmission of movement from the driven element to the output.

In some such mechanisms, at least one of the inputs can engage the driven element to deflect it from transmitting motion to the output. In other such mechanisms, the positions of the inputs define the position of at least one control element, which has multiple positions, and where the determination of whether or not movement of the driven element is transmitted to the output is the same for more than one position. In such mechanisms, the control element may serve to provide a path for transmission of motion between the driven element and the output, while in others it may serve to block movement of at least one of the driven element and the output.

For mechanisms having two or more inputs that determine whether or not motion is transmitted to an output, such determination may be defined by a Boolean logic operation of the positions of at least two of the inputs, and such Boolean logic operation could be a NOR, NAND, or XOR logic operation.

Some mechanisms have at least one motion-transmitting element that is selectively interposable between the driven element and the output, with the position(s) of the motion-transmitting element(s) being defined by position(s) of the input(s) such that the position(s) of the input(s) determine whether or not the motion-transmitting element(s) is/are interposed between the driven element and the output so as to transmit motion therebetween. The motion-transmitting element(s) may be attached to the input(s) and directly positioned thereby. A motion-transmitting element can be positioned by the combined positions of at least two inputs. Mechanisms may be configured such that a motion-transmitting element has an active portion, which acts to transmit motion from the driven element to the output when this portion is interposed therebetween, and an inactive portion, which can accommodate motion of the driven element without transmitting such motion to the output when this portion is interposed therebetween.

In some mechanisms, a driven element and the output have aligned positions, in which they are positioned such that motion of the driven element is transmitted to the output, and where one or more the inputs can be positioned to displace at least one of the driven element and the output away from its aligned position. In some cases, the driven element is aligned to transmit motion to the output unless it is deflected from such alignment, and at least one input acts to either deflect or not deflect the driven element. The driven element may directly engage the output when it is aligned therewith and displaced.

Some mechanisms employ a motion-controlling structure having at least one motion-control element that is positioned by the inputs to selectively place the motion-controlling structure in multiple positions, including at least a motion-accommodating configuration (where motion of the driven element can be accommodated without causing movement of the output) and a motion-transmitting configuration (where motion of the driven element is transmitted to the output by at least one element of the motion-controlling structure). In some such mechanisms, the motion-controlling structure is provided by a single motion-control element. Mechanisms can employ a control element that provides a path for transmission of motion between the driven element and an output, and/or a control element that blocks movement of the driven element, an output, or both.

A mechanism can have first and second mechanical inputs, at least one mechanical output, and at least one control element that is positionable by at least the first input, where the control element(s) acts to determine the resulting position(s) of the output(s) based on the positions of the first and second inputs, such position(s) of the output(s) being defined by a Boolean logic operation on the input positions, and wherein such at least one of the control elements provides the same function in more than one position. In such mechanisms, there may be two or more control elements, each positioned by one of the inputs. In some mechanisms, positioning of the inputs acts to position the output(s), while in others, such positioning acts to determine whether or not the output(s) is displaced by the motion of a driven element. In some mechanisms, the control element(s) determine the motion of the output(s) responsive to motion of the second input.

For many of the mechanisms as discussed above, the input(s) and the output(s) can comprise carbon nanotubes. Mechanisms can be fabricated small enough to occupy a volume no greater than 0.001 mm3, and/or to require no more than 1 µN force to position the output(s).

For many of the mechanisms discussed above, the output can be complimented by at least one complimentary output, which defines a value different from the value that is defined by the output, and where the position(s) of the input(s) determine whether or not motion is transmitted to the output or to the complimentary output(s).

BRIEF DESCRIPTION OF THE FIGURES

FIGS. 1A-1D illustrate a logic mechanism employing a balance mechanism that directs movement from a driven element to either a 0-value output or to a 1-value output, with a control element that is moved by the inputs via another balance acting to selectively block one of the outputs from moving. As depicted, the mechanism provides a NAND function.

FIGS. 2A and 2B respectively show similar mechanisms where a control element is configured to provide a NOR function and a XOR function.

FIGS. 3A-3E illustrate a logic mechanism that provides an OR logic function, and which can be employed in combination with a mechanical inverter (as shown in FIG. 3E) to provide a NOR function. This mechanism provides the output value directly based on the input values, without the action of a separate driven element to move the output.

FIGS. 6A-6D illustrate a mechanical logic mechanism where extension of either one of two inputs, or extension of both, acts to misalign a driven element with an output. If either input is extended, different positions of the driven element result in the same output value, providing a NOR logic function.

FIGS. 7A-7D illustrate another example of a mechanical logic mechanism where extension of either one of two inputs, or extension of both, acts to misalign a driven element with an output. In this mechanism, the inputs are provided on a common element, reducing the number of parts.

FIGS. 8A & 8B show a mechanism where the plate is configured to provide a NAND function output based on the positions of the inputs, while FIG. 8C shows a mechanism where the plate is configured to provide an XOR function.

DETAILED DESCRIPTION

Figure 3C:
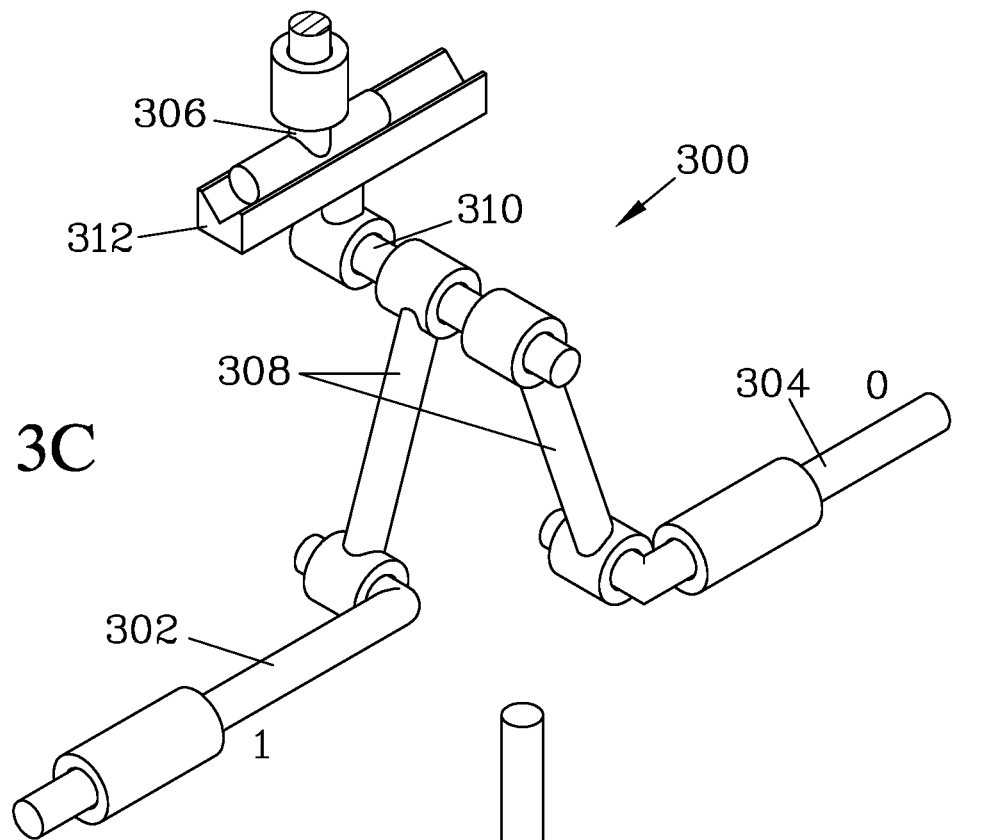

The drawings and accompanying descriptions illustrate several examples of logic mechanisms that can be built, many of which offer simplified structures, fewer parts, and/or smaller size compared to structures taught in U.S. Pat. No. 10,481,866 and related patents/applications for providing equivalent functions. While particular examples are illustrated, alternative arrangements that employ the same strategies could be designed using variations on the specific examples. It should be noted that in many cases, for reasons of clarity, additional conventional elements employed in mechanical computing devices, such as anchoring structures, guiding structures, structures for setting inputs at desired values, clock signal generators (which may comprise, e.g., motors, gears, cams, cam followers, and related linkages and other parts), structures for distributing and/or redirecting clock signals (e.g., the physical equivalent of what would be called a bus bar in electronics), elements for distributing and/or redirecting motion from outputs, buffers for temporarily holding one or more bits of information, etc. are not shown. While many of the examples shown are for structures scaled to be fabricated by conventional manufacturing techniques (including micro- and nano-scale lithography), equivalent molecular-scale and atomically-precise structures could be formed having an analogous arrangement of parts. The present application incorporates by reference the disclosure of Applicant's previously filed U.S. Provisional applications 63/083,265 and 63/083,276 as well as concurrently filed applications entitled Efficient and Manufacturable Mechanical Computing and Managing Non-Contact Forces in Mechanisms, in those jurisdictions where such incorporation by reference is appropriate.

Several examples of logic mechanisms that incorporate different schemes for defining positions of one or more mechanical outputs based on positions of two or more mechanical inputs are illustrated and described. In general, each input and each output is a movable element that defines or encodes a value by its position. In one scheme, displacement from a neutral position indicates a value of 1, while lack of such displacement indicates a value of 0. In another scheme, a set of complimentary elements may be employed, with one of multiple elements moving to indicate a value, such as for an output value. In a binary example, one output moves to indicate a 1-value output, while another output moves to indicate a 0-value output. These output options may be matched to corresponding input options of other mechanisms; mechanisms can be set up to use single input or dual input (also called "single rail" and "dual rail"). Dual rail input is where each possible input and input value has its own line. For example, if there are two inputs, A and B, and each can have a value of 0 or 1, then there are four input lines: A=0, A=1, B=0, and B=1. For any computations, one input line for each input is set to a position that logically means "true." For example, if (A, B)=(1, 0) then the A=1 line is set, and the B=0 line is set. This differs from a scheme where 1 line represents A, and 1 line represents B, and different positions of the line determine whether the values are, e.g., 0 or 1 (typically displaced for 1, not displaced for 0). Single input reduces the number of input lines, but dual input can have advantages in simplifying or otherwise improving mechanisms. Any logic can be performed either way.

For a particular use, it may be beneficial to combine features of particular examples to provide mechanical logic mechanisms optimized for a particular situation and/or use. In some mechanisms, positioning the input(s) serves to directly position the output(s); in others, positioning the input(s) defines the position(s) of the output(s) responsive to displacement of a driven element such as a mechanical clock signal. Such a driven element could be considered as an input, but one that is displaced sequentially to positioning one or more data inputs. Examples of mechanisms suitable for providing clock signals for mechanical computing devices are taught in U.S. Pat. No. 10,683,924 and PCT/US2020/031645, incorporated herein by reference in those jurisdictions where such incorporation is appropriate.

In some logic mechanisms taught herein, the mechanism is designed such that a mechanical output value is dependent on whether elements are or are not aligned, such alignment or misalignment being based on the positions of one or more mechanical input values, and such alignment or misalignment functioning to determine whether or not there is a path to convey movement from a driven element (which, as used herein, may be a "clock signal", or "input") to a particular output. Mechanical inputs may be positioned to place elements into alignment to form a path to transmit movement, and/or may act to displace elements from alignment to avoid creating such a path. Mechanical inputs may serve to directly deflect or align a driven element to cause it to not engage or engage a particular output when the driven element is displaced, such as by a mechanical clock signal. In some mechanisms, alignment or misalignment to define a path to transmit motion to an output could be characterized as the input(s) defining the constraint placed on available free motion of the driven element, determining whether or not movement of the driven element can or cannot be accommodated without it applying force to move an output.

In some logic mechanisms, inputs act in parallel to determine whether an aligned path of movement transmission exists or doesn't exist. In addition to the inputs themselves, elements that are positioned by the inputs and determine whether or not a path to convey movement exists may be employed, and may be considered to be "control elements", "motion-transmitting elements", and/or "motion-control elements", depending on the particular configuration of the mechanism.

In the logic mechanisms taught herein, one or more components are configured to conflate input positions to provide the same resulting output value for different input values. In some mechanisms, such conflation results from alignment and/or misalignment of elements, in a manner as discussed above, where different positions of inputs provide alignment or misalignment (more typically) of similar elements. In some mechanisms, such conflation results from at least one component in the logic mechanism that provides the same mechanical effect in the mechanism in more than one position, such as a blocking element having more than one position which serves to block a particular output from moving, a control element that moves another element the same distance in either of two positions, or a control element that either accommodates or transmits motion in more than one position.

Various mechanisms taught herein provide the "universal" logic functions of NOR or NAND gates, which can be configured and/or combined to provide any other Boolean logic function. With an appropriate clocking scheme, NOR or NAND gates can be connected to form a flip-flop to provide memory; more sophisticated mechanisms for providing arithmetic logic operations and/or memory based on simple logic gates could be formed in a manner parallel to that in which such higher-level mechanisms have been constructed using analogous electronic logic gates and combinations thereof into, e.g., shift registers, adders, and even higher-level mechanisms, up to complete computing systems. Other devices using the same paradigms could be designed, such as half-adders, full adders, ripple-carry adders, etc. While higher level mechanisms could be formed from universal gates in a manner analogous to constructing higher-level structures from electronic logic gates, such mechanisms could also be made more directly using the paradigms taught herein for obtaining one or more output values based on one or more input values.

Due to the relatively simple structure of the mechanisms discussed herein, they are suitable for fabrication on a micro-scale, using conventional MEMS fabrication technology, or on a nano-scale, using techniques such as nano-lithography or molecular assembly by mechanosynthesis. The resulting mechanisms, when fabricated on a microscale, should be able to fit within the volume of a cube measuring 100 µm on a side, and such devices are expected to require an actuation force of no greater than 1 µN. Smaller size mechanisms could be fabricated to fit within the volume of a 10 µm or 1 µm cube, with correspondingly lower activation forces, such as 100 nN or 10 nN. Even smaller devices could be made by nano-scale fabrication techniques, and could fit within the volume of a cube 100 nm one a side, and or even small enough to fit inside a 50 nm cube, a 25 nm cube, or a 10 nm cube. For many of the mechanisms discussed herein, components such as the recited first and second parts, inputs, and outputs can comprise carbon nanotubes or structures of diamond, lonsdaleite, or diamondoid materials. For nano-scale mechanisms, actuation forces could be 1 nN or less, and molecular dynamics simulations indicate that some mechanisms such as logic gates employing NCFs to coordinate movement of the component should function with actuation forces below 100 pN, or even less than 10 pN.

For nano-scale mechanisms, many of the elements could be formed from materials such as carbon nanotubes (CNTs), diamond, Lonsdaleite, and/or diamondoid for rigid structures. CNTs can be curved and branched to a desired configuration formed by substituting pentagons and heptagons into the otherwise hexagonal structure of carbon atoms. For flexible elements, materials such as graphene sheets, ribbons, or similar graphene forms, polyyne, polytetrafluoroethylene, a hydrocarbon or substituted variant thereof, or any other structure providing the desired characteristics of appropriate diameter, longitudinal stiffness, and lateral flexibility desired for a particular use. Hydrocarbon hinges, single bond (e.g., acetylenic) rotary joints, or nested CNTs could be used to provide pivoting joints between connected elements. Such examples should not be considered as limiting the materials that could be employed.

FIGS. 1A-D illustrate a mechanism 100 which, as illustrated, is configured to provide a NAND gate. The mechanism 100 has inputs 102 and 104, formed on a flexible U-shaped member that engages a balance 106; the balance 106 in turn positions a control element 108 having a notch 110. The mechanism 100 also has a driven element 112, which is another flexible U-shaped component that serves the function of a balance, having two outputs 114 and 116 formed thereon. Depending on the position of the control element 108, the notch 110 may be positioned to allow passage of the output 114 (here selected to represent an output value of 0) or the output 116 (selected to have an output value of 1) responsive to the driven element 112 being displaced (as shown in phantom lines). In the example illustrated, the control element 108 is configured such that, for input positions of (0, 0), (0, 1), and (1, 0) (as respectively shown in FIGS. 1A, 1B, and 1C), the notch 110 is positioned to allow the 1-value output 116 to pass therethrough, while the control element 108 blocks the 0-value output 114 from moving. For the input values (1, 1), as shown in FIG. 1D, the notch 110 is positioned to allow the 0-value output 114 to pass therethrough, while the control element 108 blocks the 1-value output 116. Even though the control element 108 is at a different position for input values (0, 1) (FIG. 1B) and (1, 0) (FIG. 1C) than for input values (0, 0) (FIG. 1A), both these positions of the control element 108 provide the same function of blocking the 0-value output 114 while allowing motion of the 1-value output 116, and result in the same position of the outputs (114, 116) when the driven element 112 is displaced. While a NAND gate is shown, alternative logic operations could be provided by changing the configuration of the control element and/or by changing the values assigned to the outputs; two examples are shown in FIGS. 2A & 2B. Because the input balance, driven element, and control element are planar structures, a molecular-scale logic mechanism using this scheme could employ graphene tape to provide these elements, while the remaining components could be fabricated from diamondoid material or modified CNTs.

FIG. 2A illustrates a mechanism 200 having a control element 202 that replaces the control element 108, and provides a NOR logic function on the inputs (102, 104). When the inputs (102, 104) are undisplaced as shown in FIG. 2A, representing input values (0, 0), the control element 202 is positioned and configured such that a notch 204 is positioned to allow motion of the 1-value output 116, while the control element 202 blocks motion of the 0-value output 114; for input values (0, 0), the output value is 1 when the driven element 112 is displaced. Displacement of either or both of the inputs (102, 104) moves the control element 202 such that it blocks motion of the 1-value output 116, and moves a notch 206 to a position where it allows motion of the 0-value output 114. For input values (0, 1), (1, 0), and (1, 1), the output value is 0 (note that in this particular case, a single wider notch could provide the function of both notches (204, 206) shown). The control element 202 provides the same function (allowing motion of output 114 and blocking output 116) in more than one position.

FIG. 2B illustrates another alternative, a mechanism 250 that provides an XOR logic function of the inputs (102, 104). The mechanism 250 has a control element 252 having a single 1-value notch 254 and a pair of 0-value notches 256. The control element 252 is configured such that the 1-value notch 254 is positioned to allow motion of the 1-value output 116 only when one of the inputs (102, 104) has been displaced, but not both. When the 1-value notch 254 is so positioned, the control element 252 is positioned to block motion of the 0-value output 114 (the 0-value notches 256 bracket the 0-value output 114); for input values (0, 1) or (1, 0), the output value when the driven element 112 is displaced is 1. In the case where neither of the inputs (102, 104) has been displaced or where both have been, one of the 0-value notches 256 is positioned to allow displacement of the 0-value output 114, while the control element 252 is positioned to block movement of the 1-value output 116. For input values (0, 0) or (1, 1), the output value when the driven element 112 is displaced is 0. The control element 252 again provides the same function in more than one position.

FIGS. 3A-3E illustrate a mechanism 300 which employs opposed inputs 302 and 304, and which is configured to provide an output 306 defined by an OR function of the inputs (302, 304). In this case, the output 306 is directly positioned by the action of the inputs (302, 304); there is no separate driven element that moves the output 306 (however, the mechanism 300 could be operated sequentially, with one of the inputs displaced before the other, in which case the input displaced later has a similar effect to a driven element). As illustrated, the mechanism 300 is composed primarily of cylindrical elements, making it well-suited to nano-scale fabrication using modified CNTs.

Each of the inputs (302, 304) is pivotably connected to a link member 308, and the link members 308 are in turn pivotably connected about a common axis to an intermediate member 310 (it should be noted that the link members 308 and the intermediate member 310 can all be considered as "control elements"). The intermediate member 310 is provided with an output bar 312 that extends parallel to the inputs (302, 304), which in turn engages the output 306 to position the output 306 along an axis normal to the movement axes of the inputs (302, 304). For a nano-scale mechanism, contact between the output bar 312 and the output 306 can be maintained by van der Waals attraction, and the structure may be designed to increase the attraction between the elements (such as by providing a trough or channel on one that is slidably engaged by an axial protrusion on the other aligned with the trough); for larger-scale mechanisms, alternative structure to provide a sliding connection between the elements and/or guiding/supporting structure to maintain them engaged could be provided. When the inputs (302, 304) are not displaced (input values (0, 0) as shown in FIG. 3A), the intermediate member 310 is in a lowered position, and the output 306 is not displaced (indicating an output value of 0). If only the input 304 is displaced (input values (0, 1) as shown in FIG. 3B), the combined action of the link members 308 to accommodate such displacement of the input 304 acts as a hinge to elevate the intermediate member 310, and the engagement of the output bar 312 with the output 306 displaces it to indicate an output value of 1. Similarly, if only the input 302 is displaced (input values (1, 0) as shown in FIG. 3C), the intermediate member 310 is raised to the same elevation, and the output 306 is again displaced. It should be noted that the intermediate member 310 occupies a different position than for the input values (0, 1), and thus the output bar 312 engages the output 306 at a different location along its length, but the elevation of the displacement is the same.

Figure 3D:
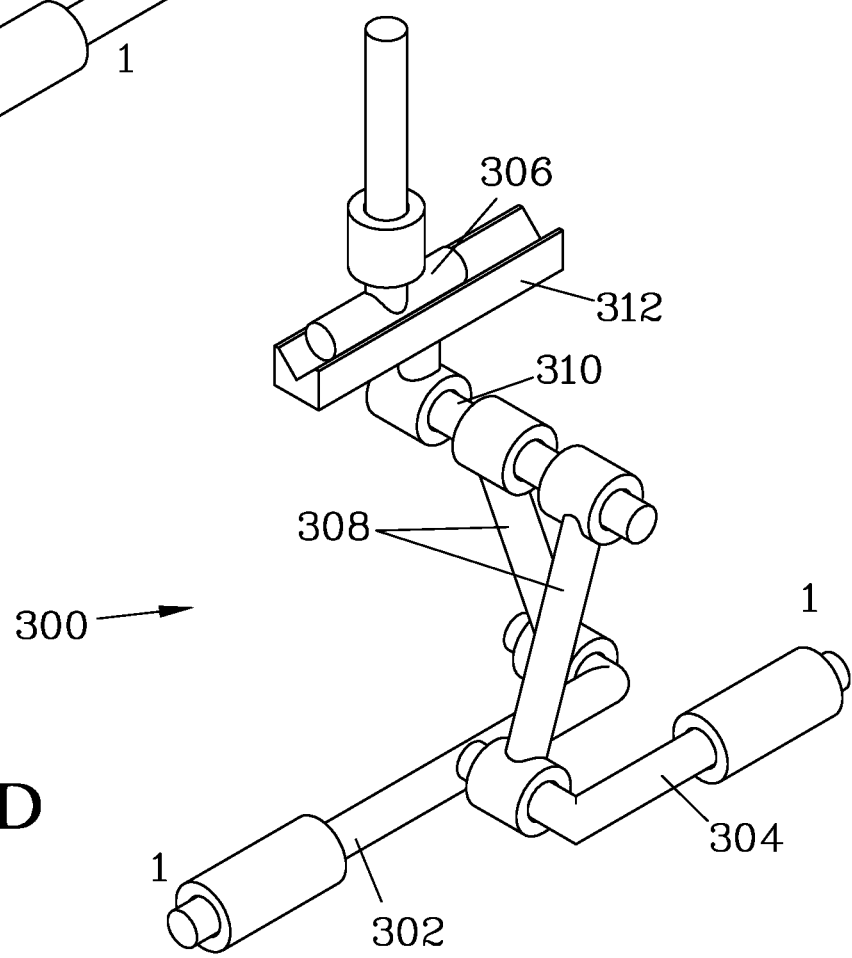
Figure 3E:
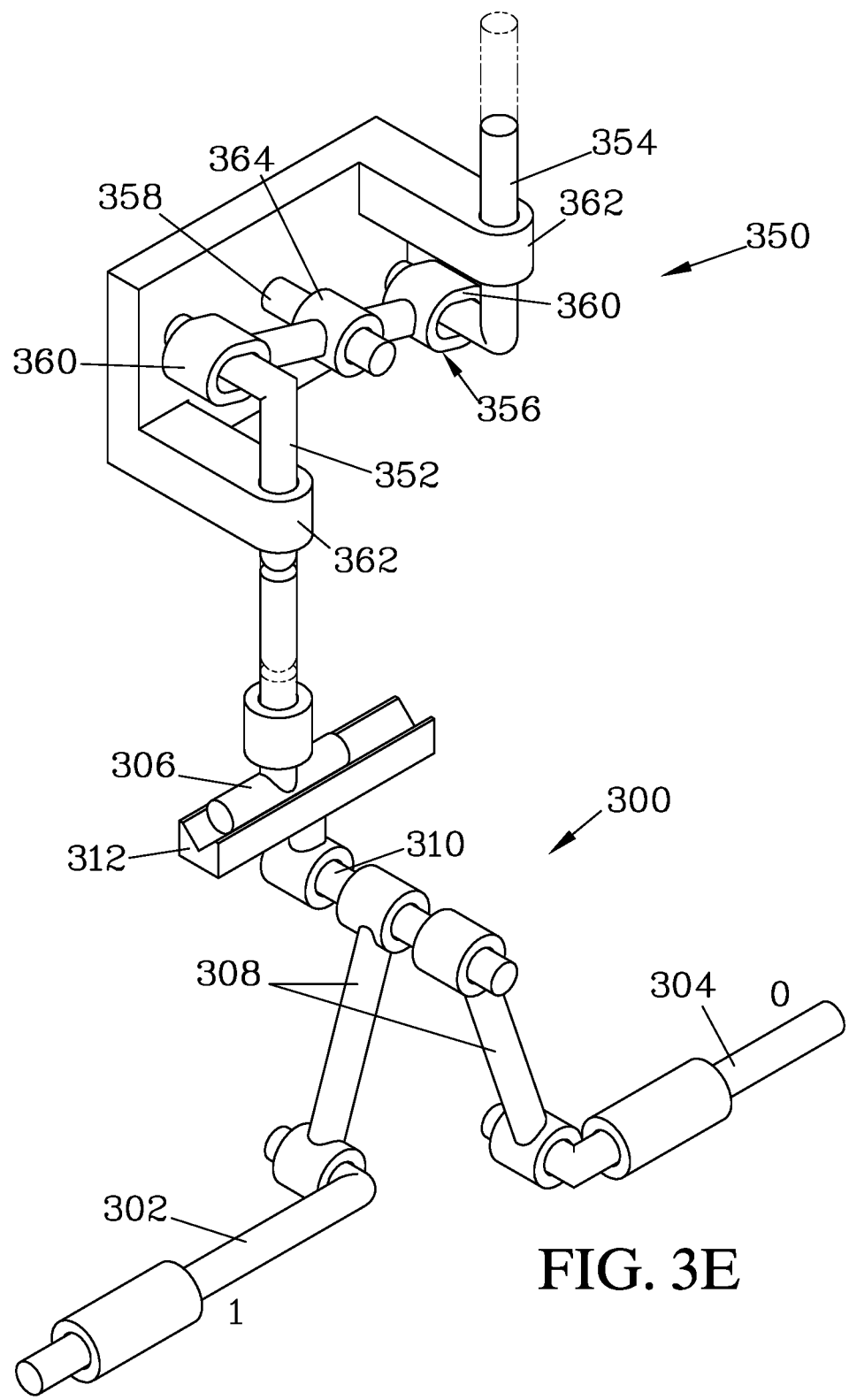

The link members 306 are configured relative to the displacements of the inputs (302, 304) such that (when in their elevated position) they form a triangle where the base of the triangle equals half the distance of the throw of either of the inputs (302, 304). When both inputs (302, 304) are displaced (input values (1, 1) as shown in FIG. 3D), the link members 308 are pushed past each other to a position where they form legs of the same triangle, but with their positions reversed (as a result, the displacement of each input (302, 304) is ⅔ the base of the triangle that is formed when neither input (302, 304) is displaced). This again raises the control element 310 to its elevated position, and it in turn displaces the output 306 to indicate an output value of 1. The link members 308 provide the same function in raising the intermediate member 310 when they are in two different positions. It should also be noted that, when the inputs (302, 304) are both moved to their 1-value positions, the link members 308 raise the intermediate member 310 through a position where it is higher before reaching the final position shown in FIG. 3D.

The output 306 is 0 if both inputs (302, 304) are 0, and is 1 if either or both inputs (302, 304) are 1, providing an OR logic function. The value of the output 306 can be inverted to provide a NOR logic function (providing a "universal" gate), such as by using an inverter 350 as shown in FIG. 15E. The inverter 350 has an inverter input 352 and an inverter output 354, both of which are pivotably engaged with a lever 356 that itself pivots about a pivot pin 358. The inverter input 352 and the inverter output 354 each pivotably engage a slotted portion 360 of the lever 356, allowing a limited degree of translation along the length of the lever 356 to avoid binding, while the motion of the inverter input 352 and the inverter output 354 are limited to translation by sleeves 362, which in turn are fixed with respect to the pivot pin 358. The lever 356 engages the pivot pin 358 via a lever bearing 364, which limits the lever 356 to pivoting motion about the axis of the pivot pin 358. When the output 1506 is displaced, it displaces the inverter input 352, which in turn displaces the slotted portion 360 with which it is engaged, forcing the lever 356 to pivot. This pivoting results in movement of the slotted element 360 that is engaged with the inverter output 354, withdrawing the inverter output 354 to a lower position. While such lowered position is actually a displacement of the inverter output 354, it corresponds to the convention of the mechanism 300 of a lower position being undisplaced, indicating an output value of 0, while an upper position indicates a displaced output value of 1. It should be noted that the inverter illustrated is only one example of a mechanism for reversing the apparent direction of a motion that could be employed, and that inverters such as shown could be employed with any of the various mechanisms disclosed herein, and could be applied to the input(s), output(s), or both. Alternatively, mechanisms could be arranged relative to each other such that a displaced position of one corresponds to an undisplaced position of the next, with the output of one connected to the input of another, as discussed below with regard to FIG. 4D.

Figure 4A:
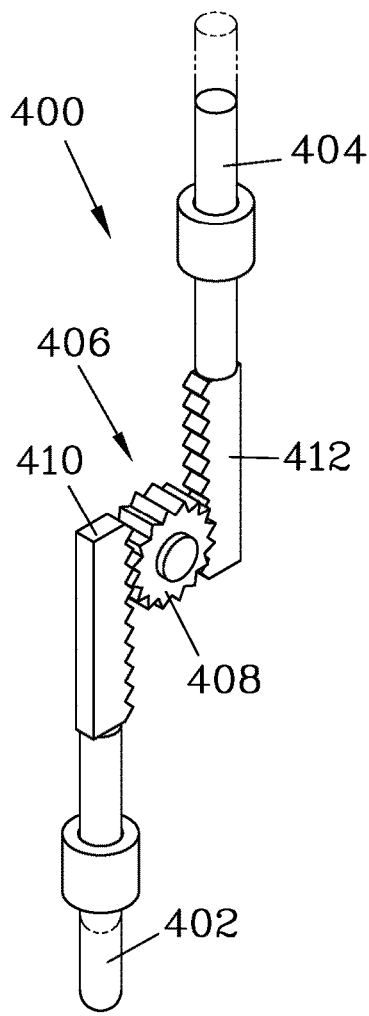
FIGS. 4A-4C illustrate some examples of mechanical inverters that offer alternatives to the inverter shown in FIG. 3E.
Figure 4B:
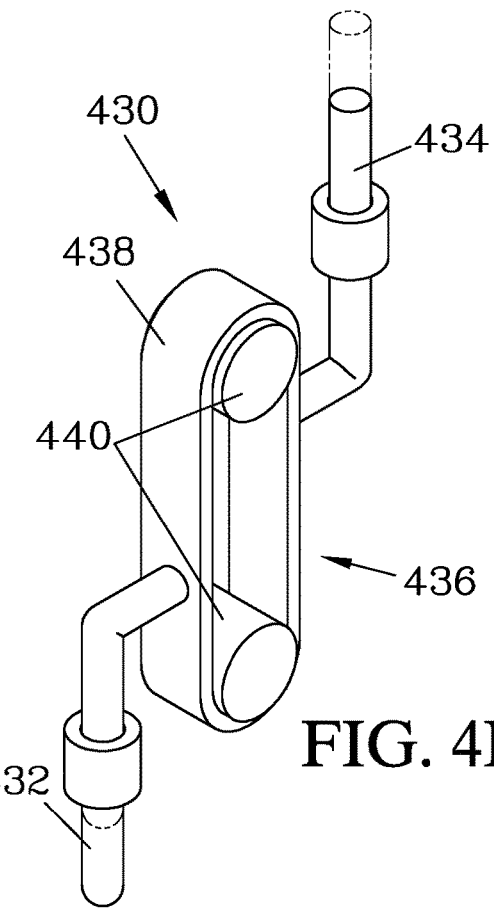
Figure 4C:
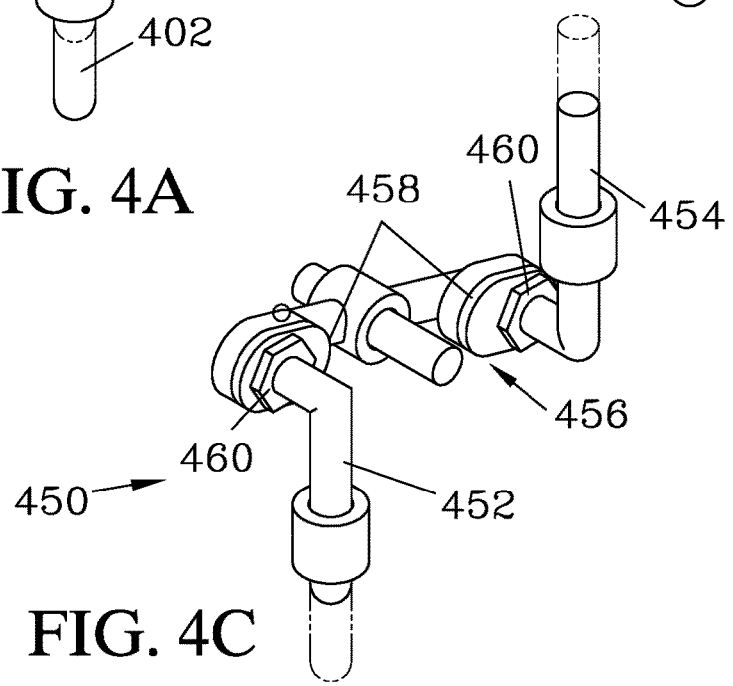
Figure 4D:
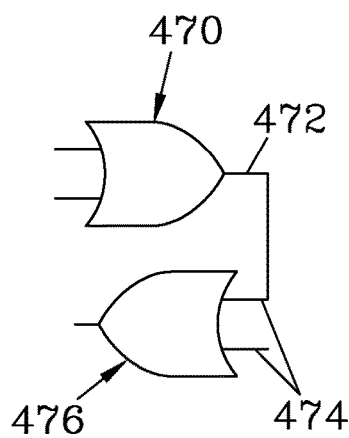
FIG. 4D shows an example of how the orientation of successive gates can be reversed to achieve the effect of an inverted output.

FIGS. 4A-4C illustrate some examples of alternative inverters that could be employed, either with the mechanism 300 or with other mechanisms where it is desired to invert an input or output. FIG. 4A illustrates an inverter 400 having an inverter input 402 and an inverter output 404, which are moved reciprocally by a rack-and-pinon mechanism 406. The rack-and-pinion mechanism 406 has a pinion gear 408, which engages an input rack 410, attached to the inverter input 402, and an output rack 412, attached to the inverter output 404. FIG. 4B illustrates an inverter 430 having an inverter input 432 and an inverter output 434 that are moved reciprocally by a belt mechanism 436. The belt mechanism 436 has a belt 438 that passes over a pair of rollers 440, and the inverter input 432 and the inverter output 434 are attached to the belt 438 on opposite sides. FIG. 4C illustrates an inverter 450 that functions similarly to the inverter 350, having an input 452 and an output 454 that are connected by a lever 456; however, in the inverter 450 the lever 456 has tracks 458 rather than slotted portions. The tracks 458 accommodate some radial motion of the inverter input 452 and the inverter output 454 to avoid binding, while engaging these elements (452, 454) via non-contact forces such as Van Der Waals attraction. The inverter input 452 and the inverter output 454 can be provided with extended feet 460 to increase their force of engagement with the tracks 458. FIG. 4D illustrates the concept of reversing the orientation of one mechanism relative to another to achieve the effect of an inverted output. Gate 470 has an output 472 that provides an input 474 for gate 476. However, gate 476 is oriented in reverse to gate 470, and thus an extended (1-value) position for output 472 is seen by gate 476 as a retracted (0-value) position.

Figure 5A:
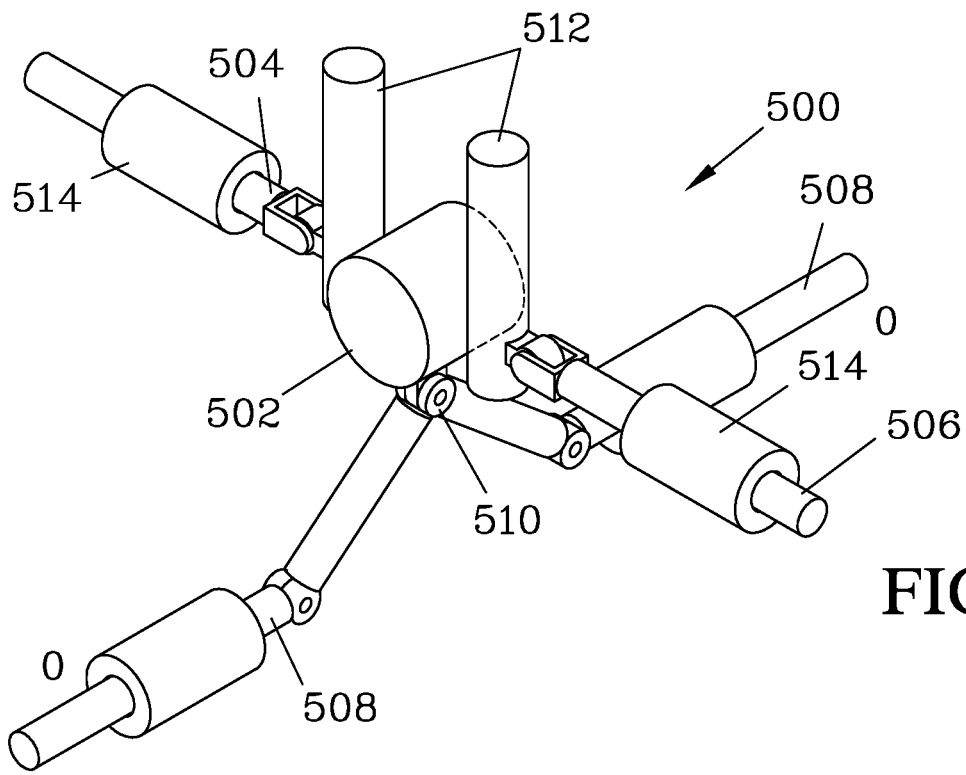
FIGS. 5A-5F illustrate a logic mechanism that provides a NOR function of two inputs, where a single motion-transmitting element is either aligned to transmit motion of a driven element or not so aligned. The position of the motion-transmitting element is determined by the combined positions of the two inputs.
Figure 5B:
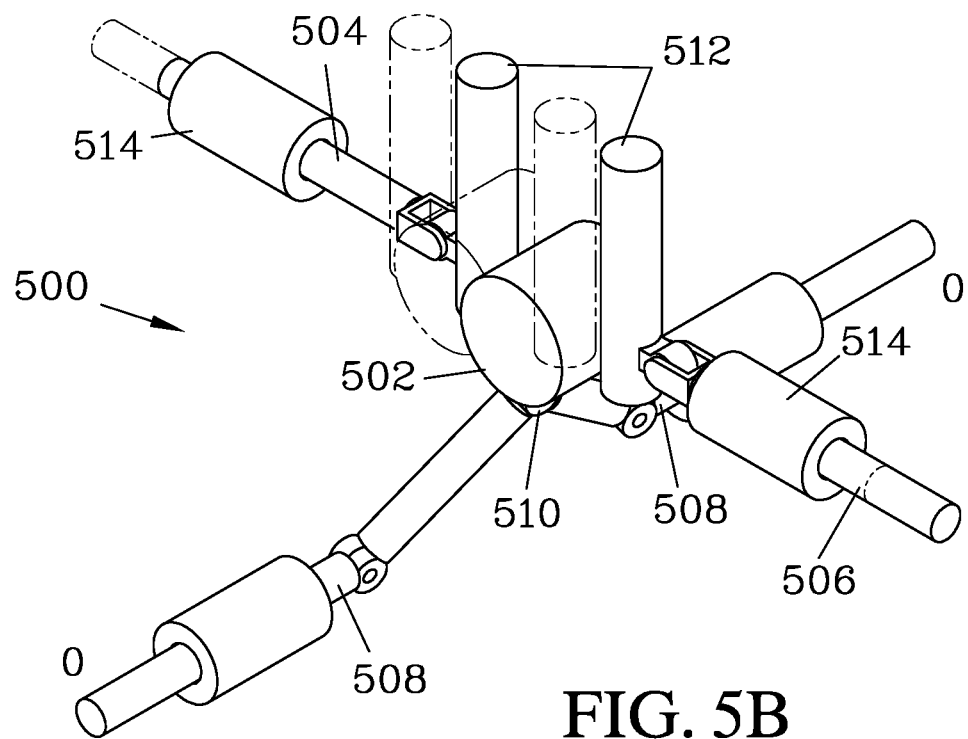
Figure 5C:
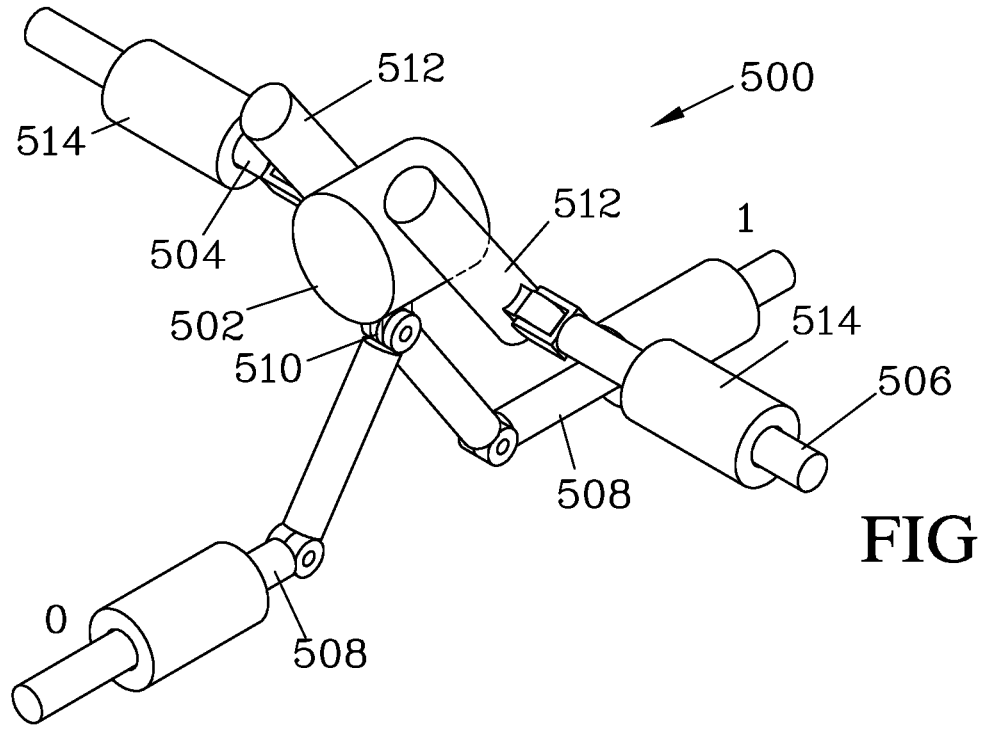
Figure 5D:
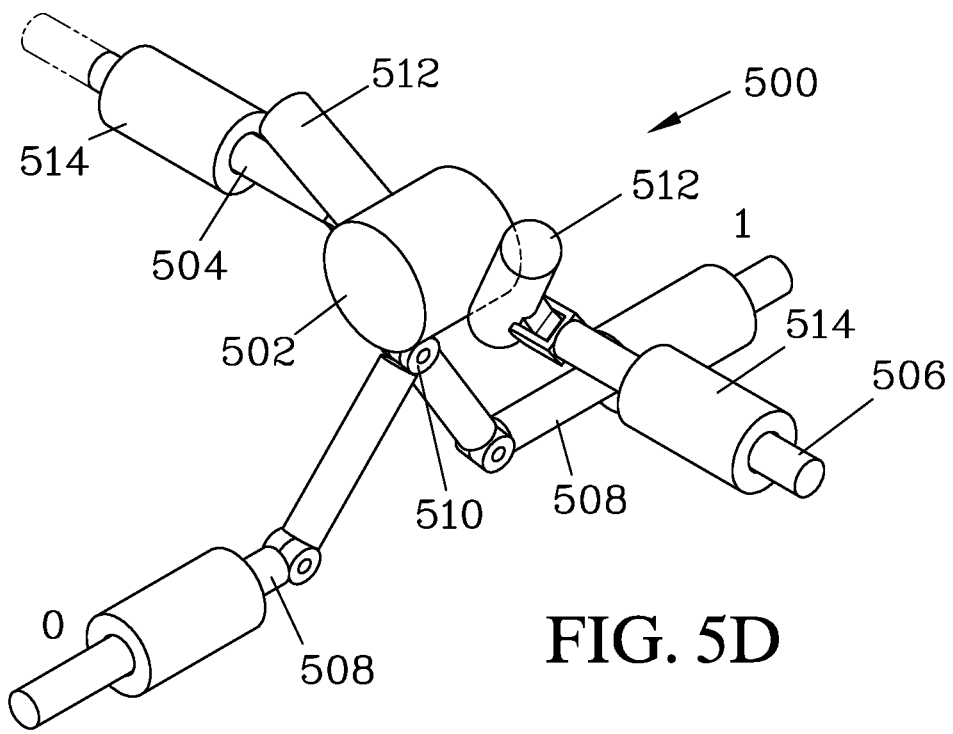
Figure 5E:
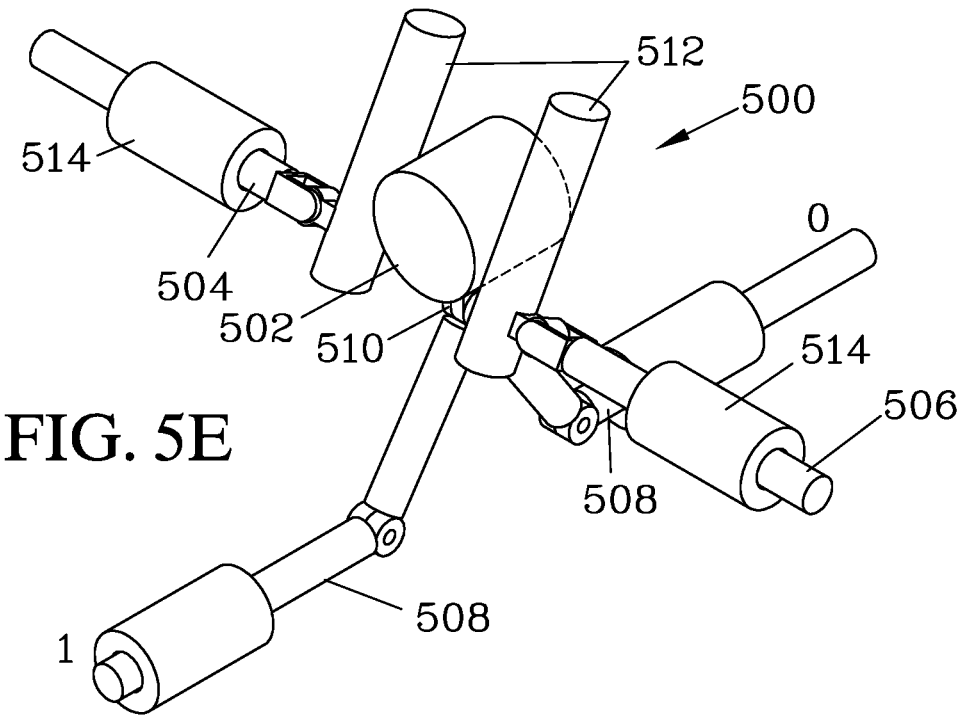
Figure 5F:
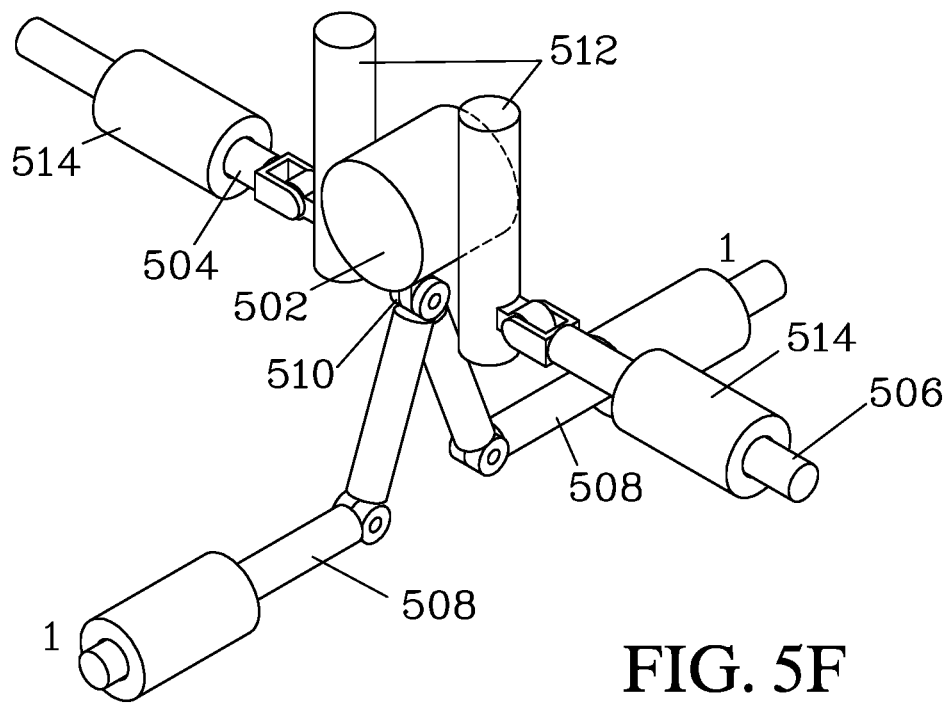

FIGS. 5A-5F illustrate a mechanism 500 that provides a NOR logic function, as well as avoiding the potential need to overcome VDW forces in order to either form or disrupt a path for transmitting movement responsive to input values. In the mechanism 500, a single motion-transmitting element 502 is either positioned in alignment to transmit motion from a driven element 504 to an output 506 (as shown in FIGS. 5A & 5B for input values (0, 0), respectively showing before and after moving the driven element 504), or is positioned out of alignment so as to not transmit motion (as shown in FIGS. 5C-5F, with FIG. 5D showing the mechanism 500 in one of such positions when the driven element 504 has been displaced). The position of the motion-transmitting element 502 in this mechanism is dependent on two inputs 508, each of which acts to move one side of a hinge 510 to which the motion-transmitting element 502 is mounted. The hinge 510 can be considered a "control element" that is positioned by the combined positions of the inputs 508, and the motion-transmitting element 502 can be placed into any of three misaligned positions. To avoid changes in VDW forces as the motion-transmitting element 502 is moved into or out of its aligned, motion-transmitting position, the driven element 504 and the output 506 are provided with track elements 512 that can pivot to allow transmission of force when aligned with the driven element 504 and the output 506 (as shown in FIG. 5B, where the driven element 504 has been displaced, pushing the motion-transmitting element 502 and causing the hinge 510 to pivot). Rotation of the driven element 504 and the output 506 within guides 514 allows the track elements 512 to extend along the path that the motion-transmitting element 502 moves when one or both of the inputs 508 is displaced, regardless of which input(s) 508 is moved. Since the track elements 512 extend along the path of motion of the motion-transmitting element 502, the VDW force between the motion-transmitting element 502 and the track elements 512 remains constant. It should be apparent that for larger-scale implementations, where changes in VDW forces are small enough not to create sufficient resistance to movement to impact the function, the track elements 512 could be omitted.

In some mechanisms, a driven element is aligned with an output by default, and when displaced, acts to displace the output unless one or both of these elements is deflected from the default alignment. In such cases, one or more inputs can determine whether or not an element is deflected. Inputs can push directly on one of the elements, or can move a guide through which an element passes. In some cases, one or more inputs can serve to position one or more motion-transmitting elements that is interposable between the driven element and the output.

Figure 6A:
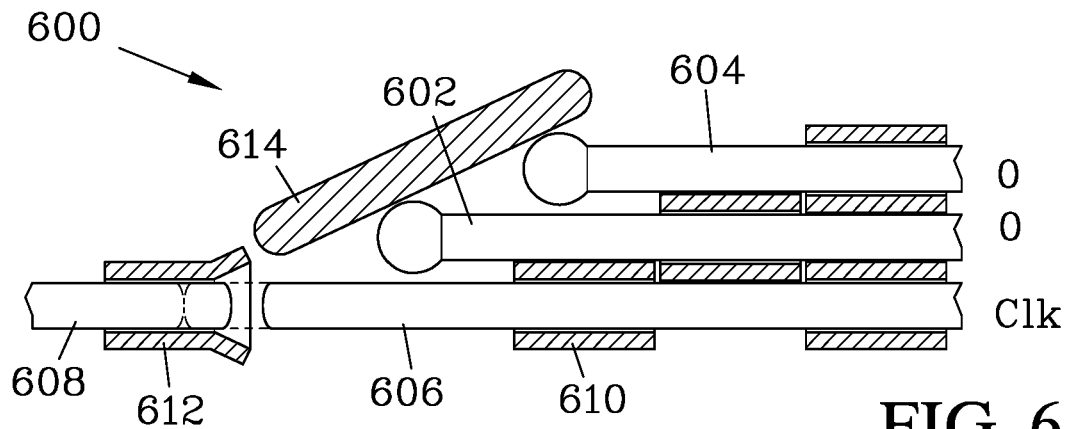
Figure 6B:
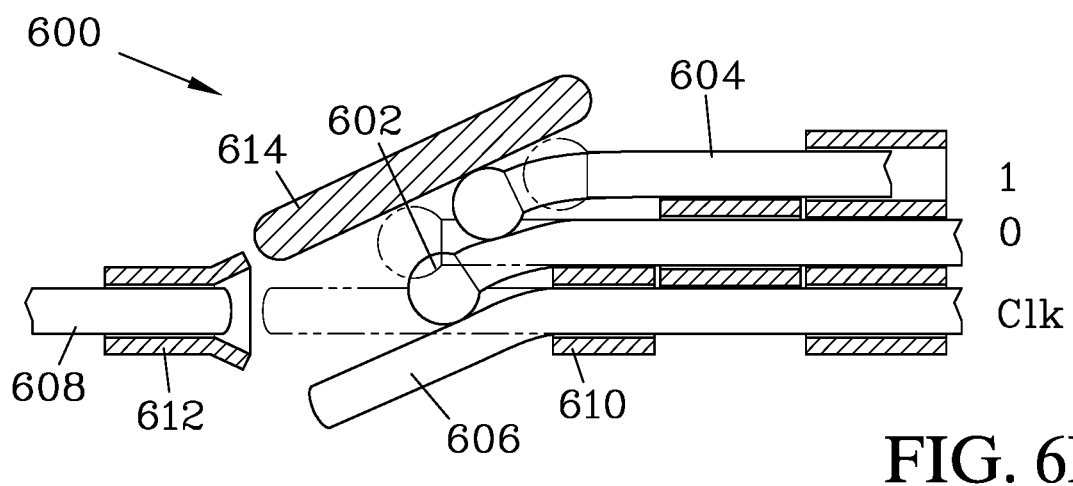
Figure 6C:
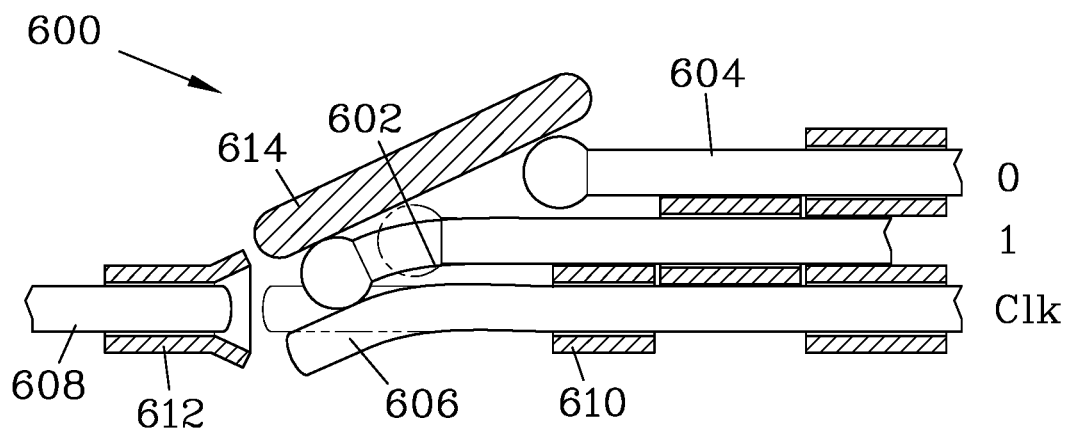

FIGS. 6A-6D illustrate a mechanism that provides a NOR gate 600, having inputs 602 and 604, a driven element 606, and an output 608. In the gate 600, the driven element 606 is resiliently flexible, and slides within a clock guide 610 that is aligned with an output guide 612 in which the output 608 slides (which may be flared, as shown, to facilitate alignment). If not deflected, the driven element 606 engages and pushes on the output 608 when the driven element is moved (such as by a mechanical clock signal), thereby pushing the output 608 to a displaced position (1-value in this example), as shown in FIG. 6A. However, as shown in FIGS. 6B-6D, if either of the inputs (602, 604) is extended (its I-value position in this example), such input (602, 604) is forced off-axis by a ramp 614 and deflects the driven element 606 out of alignment (either directly, in the case of input 602, or via the other input 602, in the case of input 604). It is noteworthy that the driven element 606 can be displaced to various positions, some where it just misses entering the output guide 612, or further deflected positions, depending on the different input values and the configurations of the inputs (602, 604) and the ramp 614 relative to the driven element 606. As long as driven element 606 is deflected far enough to avoid entering the output guide 612, the exact positions of inputs 602 and 604 and driven element 606 do not affect the position of output 608. The NOR gate 600 has only four moving parts, including the output 608. In a nanoscale mechanism, the guides (610, 612) and ramp 614 could be provided by diamondoid material or modified CNTs, while the movable elements (602, 604, 606, 608) could be provided by resiliently flexible molecules such as polyyne, polytetrafluorethylene, a hydrocarbon or substituted variant thereof, a graphene-based structure, or any other structure of appropriate diameter, longitudinal stiffness, and lateral flexibility, possibly having low drag with respect to movement within guides.

Figure 7C:
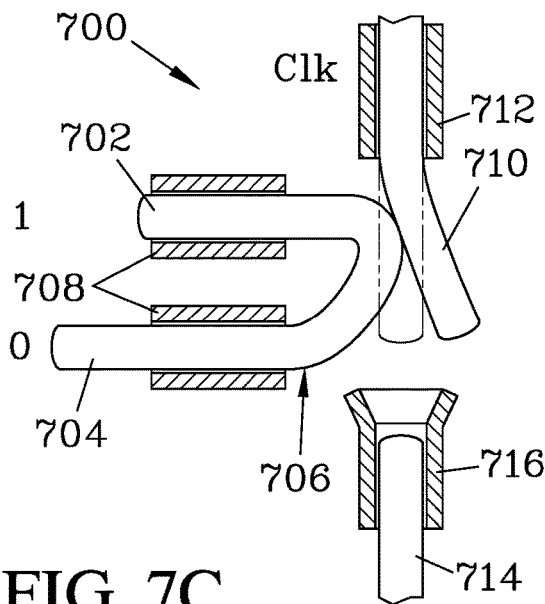
Figure 7D:
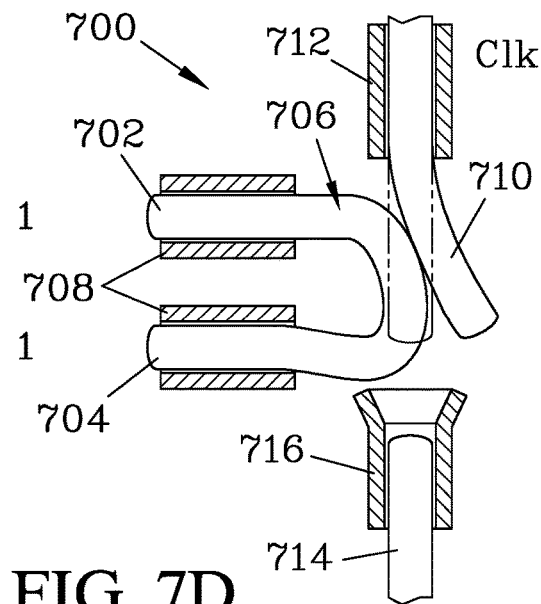

FIGS. 7A-7D illustrate another example of deflection-based mechanism, a NOR gate 700. The gate 700 employs only three moving parts, as inputs 702 and 704 are both provided on a flexible U-shaped element 706, which slides within fixed guides 708 that position it to engage and deflect a driven element 710 if either or both of the inputs (702, 704) is extended. The driven element 710 slides within a fixed guide 712. If not deflected (in the example illustrated, this is the case for the input positions (0, 0), as shown in FIG. 7A), the driven element 710 is aligned to engage an output 714 sliding within a fixed guide 716 when the driven element 710 is extended. As with the gate 600, multiple positions of the driven element 710 result in the same resulting position of the output 714.

Figure 7E:
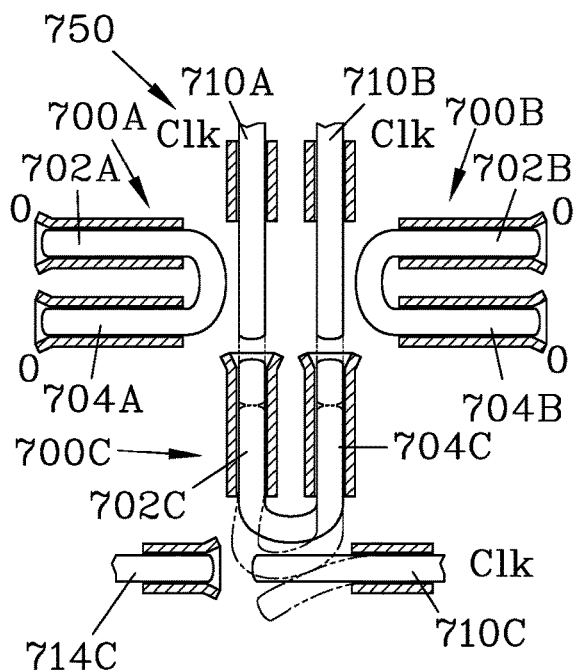
FIGS. 7E-7H show three NOR gates combined to create an AND logic output, with the output of one mechanism providing an input for another.
Figure 7F:
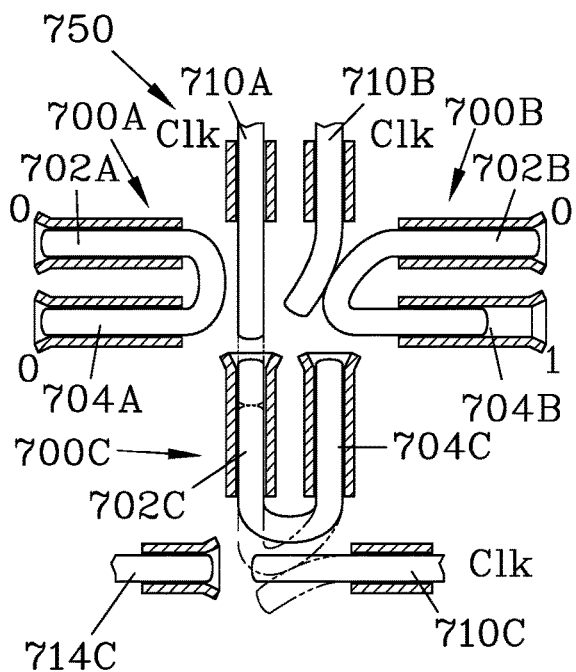
Figure 7G:
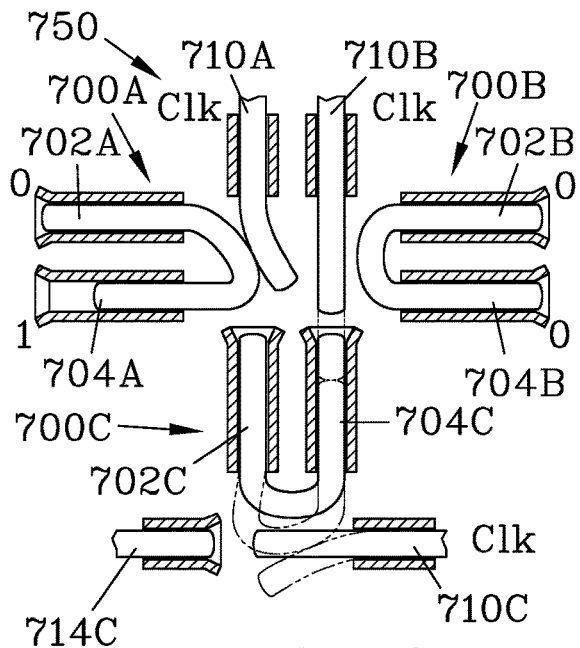
Figure 7H:
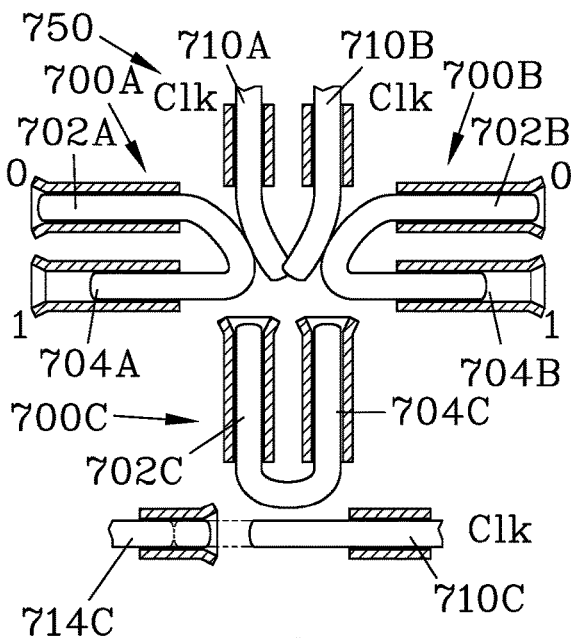

FIGS. 7E-H illustrate one example of how three gates 700A-C can be combined to form a different logic mechanism, in this example an AND logic mechanism 750, driven by driven elements 710A, 710B, and 710C. As arranged, the inputs 702C and 704C of the gate 700C are positioned to serve as the outputs of the gates 700A and 700B. If inputs 702A and 702B are held at their retracted (0-value) positions, then the inputs 704A and 704B respectively determine the positions of the inputs 702C and 704C, providing an AND function that could be inverted to provide a NAND function (inversion of output values is discussed above with respect to FIGS. 3E-4D). If neither or only one of the inputs (704A, 704B) is extended (input values (0, 0), (0, 1), (1, 0)) to force the associated driven element (710A, 710B) out of alignment, then at least one of the driven elements (710A, 710B) pushes on the associated input (702C, 704C), and deflects the driven element 710C from pushing the output 714C (as shown in FIGS. 7E-7G); the output 714C remains in place, here representing an output value of 0. It is only when both inputs (704A, 704B) are extended (input value (1, 1) as shown in FIG. 7H) that neither of the driven elements (710A, 710B) is aligned to push on the associated input (702C, 704C), so the driven element 710C is not deflected, and is aligned to push on the output 714C when displaced.

The following truth table shows the possible states when the inputs 702A and 702B are held undisplaced, such that the resulting output 714C is defined by an AND logic function of the "free" inputs 704A and 704B. This output could be inverted to provide a NAND output.

| A inputs | A output | B inputs | B output | C input A (A output) | C input B (B output) | C output |
|---|---|---|---|---|---|---|
| 0, 0 | 1 | 0, 0 | 1 | 1 | 1 | 0 |
| 0, 0 | 1 | 0, 1 | 0 | 1 | 0 | 0 |
| 0, 1 | 0 | 0, 0 | 1 | 0 | 1 | 0 |
| 0, 1 | 0 | 0, 1 | 0 | 0 | 0 | 1 |

One issue that may arise when elements are forcibly deflected is that such action may apply force tending to move an input backwards. Similar "backwards" forces can result in mechanisms where one element blocks another, but the blocking action is directed on an incline rather than perpendicular, in which case there may be a tendency to create a ramp or camming effect, or in mechanisms where motion of a blocking element is limited by engagement with the element it blocks, rather than by a fixed structure. Such "backwards" forces can accumulate in systems where multiple logic mechanisms are employed, and thus it is frequently desirable to design mechanisms so as to avoid such forces and/or to block their propagation across multiple mechanisms. Positioning blocking elements such that their movement is perpendicular to the motion that they are blocking is one common approach to avoiding such forces.

Figure 7I:
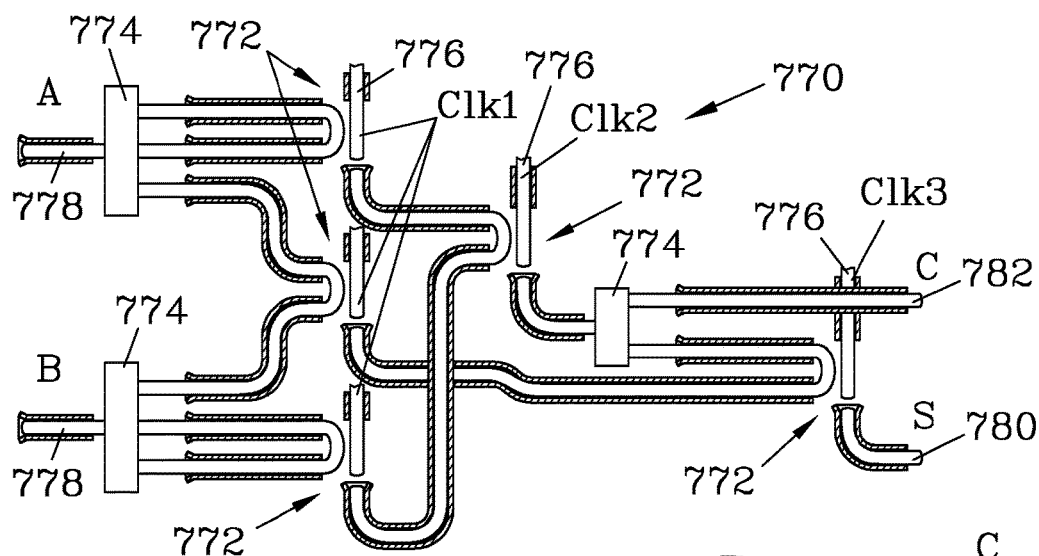
FIG. 7I shows a half-adder formed using four NOR gates (as well as signal splitters) and operated by three sequential clock pulses.
Figure 7J:
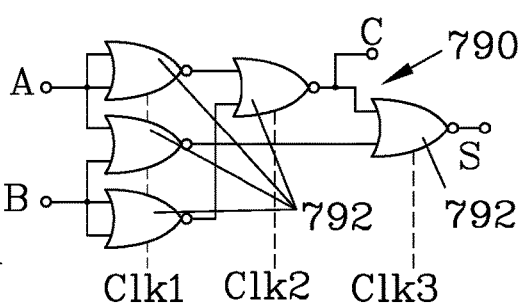
FIG. 7J shows a conventional logic diagram of an equivalent half-adder formed using four NOR gates for comparison.

FIG. 7I illustrates a half adder 770 that illustrates one example of how NOR gates similar to the NOR gates 700 discussed above can be combined into a higher-level mechanism. Five NOR gates 772 are connected together, in some case with signal splitters 774 that serve to provide multiple outputs from a single input. The gates 772 are operated by three sequential clock inputs 776. The values encoded by two data inputs 778 are sequentially processed to provide values at sum output 780 and a carry output 782. For comparison, FIG. 7J is a conventional logic circuit 790 of a half adder, which could be made with conventional NOR gates 792. The function of any circuit made using conventional NOR gates could be provided by using mechanical NOR gates similar to those discussed.

Figure 8A:
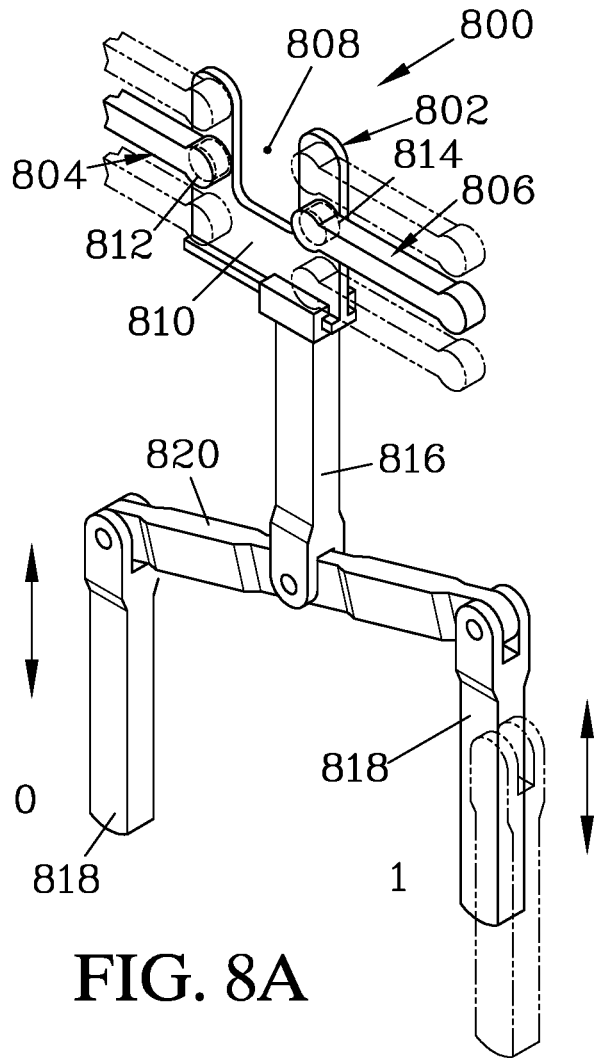
FIGS. 8A-8C illustrate two examples of logic mechanisms where the combined positions of two inputs control the position of an intermediate element (formed as a shaped plate) that can either accommodate the motion of a driven element without moving, or is forced to move therewith, in which case it transmits the motion to an output.
Figure 8B:
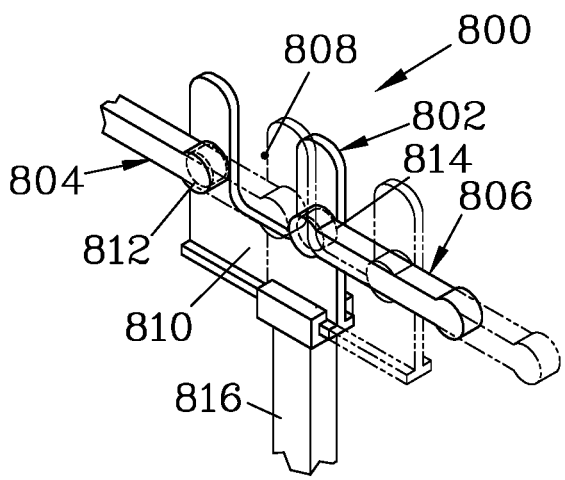
Figure 8C:
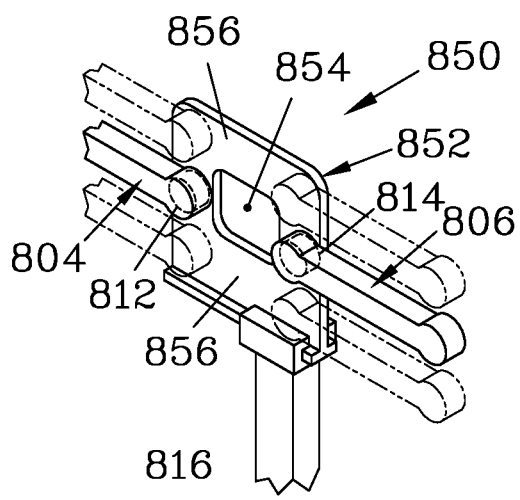
Figure 9A:
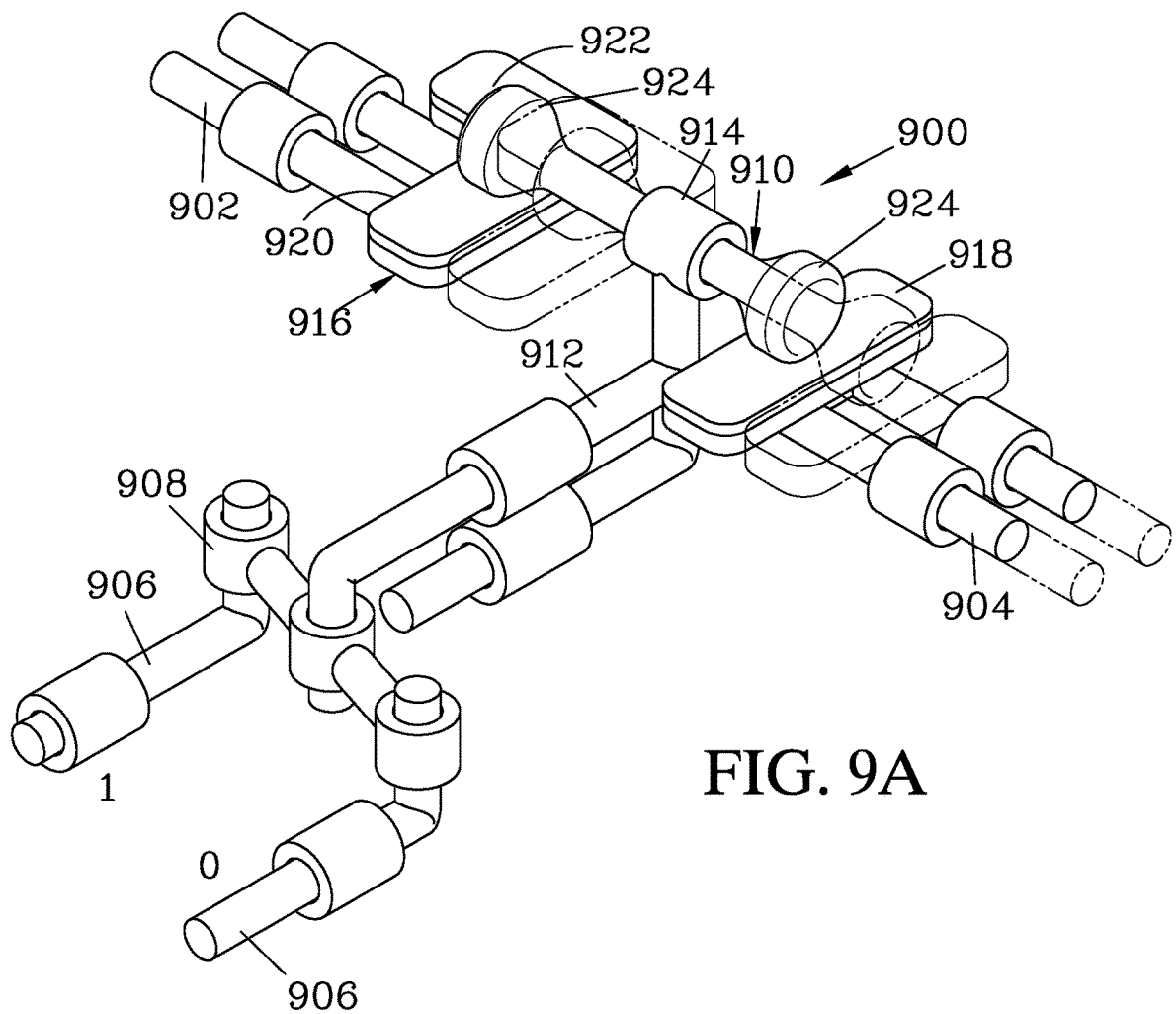
FIGS. 9A-9C illustrate two examples of mechanisms with shaped plates attached to the driven elements and outputs, and where a connector that engages the plates is positioned by the combined positions of two inputs.
Figure 9B:
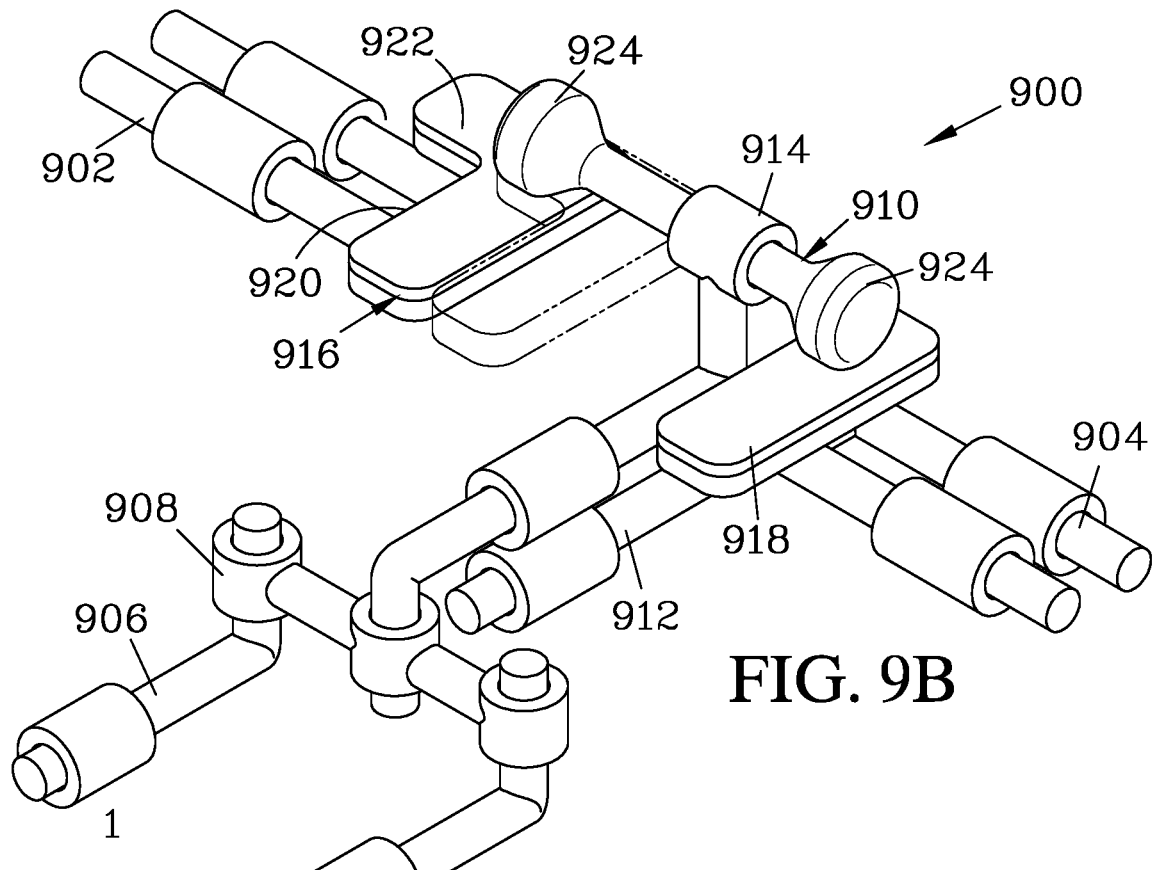
Figure 9C:
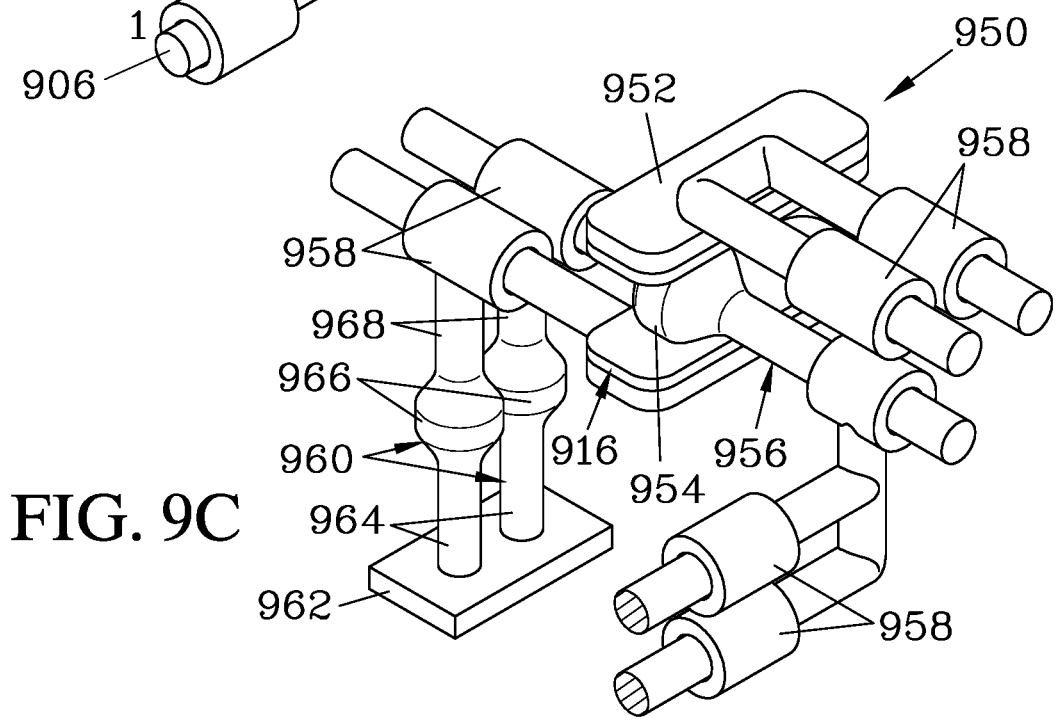

FIGS. 8A-8C illustrate two examples of mechanisms where multiple inputs determine the position of a control element (formed as a shaped plate) that can either accommodate the motion of a driven element or be moved therewith, and which moves an output when it is moved with the driven element. The control element has at least two different positions in which it provides the same function. FIGS. 8A & 8B illustrate a mechanism 800 where a plate 802 is employed to either transmit or not transmit motion from a driven element 804 to an output 806. The plate 802 has a plate cutout 808 (providing opposed edges) and a path region 810. The driven element 804 has a driven attractive element 812, and the output 806 has an output attractive element 814; both the attractive elements (812, 814) are attracted to the plate 802, and thus serve as engaging elements that interact with the active surface provided by the plate 802. The attractive elements (812, 814) could be provided by magnets (when the plate 802 is formed of a ferromagnetic material), or could be materials in a nano-scale structure where van der Waals attraction is effective (two examples of nano-scale mechanisms are shown in FIGS. 9A-9C). The plate 802 is translatably mounted to a connector 816 that moves perpendicular to the direction of translation of the driven element 804, and which is positioned by the combined action of two inputs 818, which are connected to a balance 820. The plate 802 can be positioned at three positions, depending on whether neither, one, or both of the inputs 818 is displaced. The plate 802 is configured such that the plate cutout 808 is interposed between the driven attractive element 812 and the output attractive element 814 when the plate 802 is in either a lower position (when the input values are (0,0)) or a middle position as shown (when the input values are either (0, 1) as shown, or (1, 0)). For illustrative purposes, the positions of the driven element 804 and the output 806 are shown relative to the plate 802 in three vertical positions (two of which are shown in phantom lines), even though it is the plate 802 that moves vertically, while the driven element 804 and the output 806 remain at a constant height. In either the lower or middle position of the plate 802, displacement of the driven element 804 acts to move the driven attractive element 812 against one of the edges of the cutout 808; to avoid the work required to force the driven attractive element 812 beyond the edge into the cutout 808, the plate 802 moves with the driven element 804, as shown in the partial view of FIG. 8B. Similarly, interaction of the output attractive element 814 with the cutout serves to move the output 806 with the plate 802 to avoid work to force the output attractive element 814 into the cutout 808. In either of these positions of the plate 802, corresponding to input values (0, 0), (0, 1), or (1, 0), motion of the driven element 804 is transmitted to the output 806.

When both inputs 818 are displaced, encoding input value (1, 1), the plate 802 is raised to its upper position, where the cutout 808 is no longer positioned in the path of the driven attractive element 812, and where the path region 810 is aligned with the driven attractive element 812. In this position, the motion of the driven element 804 can be accommodated by moving the driven attractive element 812 across the path region 810, without having to exert work to move the drive attractive element 812 beyond any edge. In this case, the plate 802 is not forced to move, and the plate 802 does not convey the movement of the driven element 804 to the output 806. The resulting output value responsive to movement of the driven element 840 is 1 for input values (0, 0), (0, 1), and (1, 0), and 0 for input values (1, 1), providing a NAND function. The plate 802 can be considered to be a control element that has two active or motion-transmitting positions, and one inactive or motion accommodating position. Similarly, the plate 802 could be considered as having an active portion, containing the cutout 808 and serving as a motion-transmitting element when this portion is interposed between the driven element 804 and the output 806, and an inactive portion, containing path region 810, that can accommodate movement of the driven element 804 when this portion is interposed between the driven element 804 and the output 806. In the plate 802, the cutout 808 is configured with its edges perpendicular to the direction of motion of the driven element 804 and the output 806, to avoid any unwanted cam-like forcing of the plate 802 by motion of these elements. An alternative mechanism could use a plate with a shorter cutout and a double-width path region, such that the path region is also positioned to accept motion of the driven element when only one input has been displaced. The plate of such a mechanism would have one active position and two inactive positions, and would provide a NOR function.

FIG. 8C illustrates a mechanism 850 which is similar to the mechanism 800, but which employs a different plate 852 configured to provide a XOR function; otherwise, the above remarks apply to the mechanism 850 as well. The plate 852 has a smaller cutout 854, which is bracketed by a pair of path regions 856, which can accommodate the movement of the driven element 804 when the plate 850 is in either its upper position, corresponding to input positions (1, 1), or its lower position, corresponding to input values (0, 0). For input values (0, 1) or (1, 0), the plate 852 is in its middle position (as shown), where the cutout 854 is positioned to intercept the path of the driven attractive element 812, and thus motion of the driven element 804 is conveyed by the plate 852 to the output 806. In this case, the plate 852 has one active position and two inactive positions.

FIGS. 9A & 9B illustrate a mechanism 900 that uses a principle of accommodating or transmitting motion from a driven element 902 to an output 904 that is similar to that of the mechanisms (800, 850) described above. The mechanism 900 has two inputs 906 that are connected to a balance 908, which in turn positions a connector 910 via a connector link 912. The connector link 912 has a connector sleeve 914 that allows the connector 910 to translate in a direction parallel to the motion of the driven element 902 and the output 904, while the position of the connector 910 in a direction normal to the direction of motion is determined based on the combined positions of the inputs 906.

The connector 910 is engaged via non-contact forces (NCFs) with a driven plate 916 and an output plate 918, either or both of which can be shaped to provide the desired logic response to the position of the inputs 906. Whether or not movement of the driven element 902 is transmitted to the output 904 is determined by the position of the connector 910 and the configuration of the plates (916, 918). In the mechanism 900, the driven plate 916 is L-shaped, having an edge 920 and a path region 922, and is configured such that the connector 910 is aligned with the path region 922 only when both inputs 906 are displaced. When the connector 910 is in either of the positions resulting from neither or only one of the inputs 906 being displaced (such as the intermediate position shown in FIG. 9A for inputs (1, 0)), displacement of the driven plate 916 acts to move the edge 920 in the direction of the connector 910. The connector 910 moves with the driven plate 916 to avoid having to overcome the NCF barrier to move beyond the edge 920. Similarly, NCF forces between the connector 910 and the output plate 918 act to move the output plate with the connector 910 (as shown in phantom lines in FIG. 9A). The connector 910 is formed with enlarged ends 924 for engaging the plates (916, 918).

When the connector 910 is positioned by displacement of both inputs 906 (as shown in the partial view of FIG. 9B), it is aligned with the path region 922 of the driven plate 916, and thus the motion of the driven plate 916 can be accommodated by the connector 910 simply moving along the path region 922, with no change in NCFs; since the connector 910 does not move, motion is not transmitted to the output plate 918 in this case. Displacement of the output 904 happens for input values (0, 0), (0, 1), and (1, 0), but not for input values (1, 1), providing a NAND logic function performed on two inputs 906. The mechanism 900 is similar in principal to the NAND gate mechanism 800 shown in FIGS. 8A & 8B, and driven plates and/or output plates could be configured to provide alternative responses. Examples would include a plate with a shorter edge and double-width path region, providing a NOR function, and a plate with two path regions bracketing an edge to provide an XOR function (similar to that of the mechanism 850 shown in FIG. 8C). Additionally, plates could be formed with multiple positions for the position of the connector and/or with different edge spacing to result in moving the output different distances for different positions of the connector.

Many of the mechanical logic structure taught herein are well suited to nanoscale fabrication, including molecular fabrication using mechanosynthesis. As an example, the mechanism 900 could employ plates (916, 918) formed from a diamondoid material (such as, for example, diamond or lonsdaleite), optionally with a graphene surface for contacting the connector 910 to reduce friction. The driven element 902, the output 904, the inputs 906, the balance 908, the connector 910, and the connector link 912 can all be formed from modified CNTs, with the connector 910 engaging the plates (916, 918) via van der Waals attraction. These elements can be slidably mounted in sleeves (such as connector sleeve 914) formed from larger CNTs; for example, if the sliding elements (902, 904, 906, 910, and 912) are formed from 10-0 CNTs, the sleeves can be formed from 18-0 CNTs. Similarly, the inputs 906 and connector link 912 can engage the balance 908 via sections of 18-0 CNT to provide a pivoting connection.

FIG. 9C is a partial view of a mechanism 950 that is functionally similar to the mechanism 900, but where an output plate 952 is partially superimposed over the driven plate 916, with an enlarged end 954 of a connector 956 positioned between the plates (910, 952). Superimposing the plates (910, 952) reduces the overall volume of the mechanism 950 compared to the mechanism 900. FIG. 9C also shows one example of how guide sleeves 958 can be mounted on supports 960 that are affixed to anchors 962 (only one of which is shown—the anchors for different guide sleeves 958 could be part of a single rigid structure). The anchors 962 can be surfaces of a diamond or diamondoid material such as lonsdaleite. The supports 960 can be bonded to the anchors 962 by employing base sections 964 formed of 9-0 CNTs, which provide an arrangement of carbon atoms that closely matches the hexagonal arrangement of the lonsdalite to facilitate bonding the base sections 964 thereto. The supports 960 illustrated each have a transition section 966 formed by a short section of 18-0 CNT, and a sleeve-mounting section 968 formed by a section of 10-0 CNT; the 10-0 CNT forms a stable T-branch with the 18-0 CNT that serves as the sleeve 958, and both the 10-0 and 9-0 CNTs can be transitioned into the 18-0 CNT of the transition section 966. Additionally, the 18-0 size of the transition sections 966 matches the size of the 18-0 CNTs of the sleeves 958, so that placing the sleeves 958 of each pair in contact with each other also results in the transition sections 966 being in contact with each other, serving to stabilize the spacing of the supports 960.

Although the present invention is described with reference to particular examples, other mechanisms are possible for obtaining the benefit of the present invention. Accordingly, the spirit and scope of the appended claims should not be limited to the description of the particular examples contained herein.

The invention claimed is:

1. A logic mechanism comprising:
a driven element;
two mechanical outputs that define different values;
at least two mechanical inputs, wherein said driven element is displaced sequentially to positioning said inputs; and
at least one control element positioned by said inputs, said control element(s) interacting with at least one of said driven element and said outputs to determine, based on the position(s) of said control element(s), which of said outputs motion of said driven element is transmitted to, and wherein at least one of said control element(s) provides the same mechanical effect in making such determination when said control element is in more than one position.

2. The logic mechanism of claim 1 wherein said control element serves to selectively block movement of at least one of said driven element and one of said outputs.

3. The logic mechanism of claim 1 wherein the determination of which of said outputs motion of said driven element is transmitted to is defined by a Boolean logic operation of the positions of at least two of said inputs and wherein said Boolean logic operation is a NOR, NAND, or XOR logic operation.

4. The logic mechanism of claim 1 wherein said input(s) and said output(s) comprise carbon nanotubes.

5. The logic mechanism of claim 1 wherein the logic mechanism occupies a volume no greater than 0.001 mm3.

6. The logic mechanism of claim 1 wherein the logic mechanism requires no more than 1 μN force to position said output(s).

* * * * *